(12) United States Patent
Hirayama

(10) Patent No.: US 9,059,354 B2
(45) Date of Patent: Jun. 16, 2015

(54) LIGHT-EMITTING ELEMENT HAVING NITRIDE SEMICONDUCTOR MULTIQUANTUM BARRIER, AND PROCESS FOR PRODUCTION THEREOF

(71) Applicant: Hideki Hirayama, Asaka (JP)

(72) Inventor: Hideki Hirayama, Asaka (JP)

(73) Assignee: RIKEN, Saitama (JP)

( * ) Notice: Subject to any disclaimer, the term of this patent is extended or adjusted under 35 U.S.C. 154(b) by 0 days.

(21) Appl. No.: 14/268,267

(22) Filed: May 2, 2014

(65) Prior Publication Data

US 2014/0239252 A1 Aug. 28, 2014

Related U.S. Application Data

(63) Continuation of application No. 13/580,868, filed as application No. PCT/JP2010/071524 on Nov. 25, 2010, now Pat. No. 8,759,813.

(30) Foreign Application Priority Data

Feb. 24, 2010 (JP) ................................. 2010-038912

(51) Int. Cl.
*H01L 33/06* (2010.01)
*H01L 33/04* (2010.01)
*H01L 33/32* (2010.01)

(52) U.S. Cl.
CPC ................ *H01L 33/06* (2013.01); *H01L 33/04* (2013.01); *H01L 33/32* (2013.01)

(58) Field of Classification Search
CPC .................. H01L 33/52; H01L 33/501; H01L 2933/0041; H01L 2933/005; H01L 33/50; H01L 33/60
USPC ................ 257/13, 14, 15, E33.008, E33.027, 257/E33.028; 438/47
See application file for complete search history.

(56) References Cited

U.S. PATENT DOCUMENTS

| 5,425,041 A | 6/1995 | Seko et al. |
| 5,544,187 A | 8/1996 | Kadoiwa et al. |

(Continued)

FOREIGN PATENT DOCUMENTS

| JP | 6-326406 A | 11/1994 |
| JP | 7-147449 A | 6/1995 |

(Continued)

OTHER PUBLICATIONS

International Search Report for PCT/JP2010/071524 dated Jan. 11, 2011.

(Continued)

*Primary Examiner* — Roy Potter
*Assistant Examiner* — Paul Patton
(74) *Attorney, Agent, or Firm* — Sughrue Mion, PLLC

(57) ABSTRACT

An $Al_{0.95}Ga_{0.05}N$:Mg (25 nm) single electron barrier can stop electrons having energy levels lower than the barrier height. Meanwhile, a 5-layer $Al_{0.95}Ga_{0.05}N$ (4 nm)/$Al_{0.77}Ga_{0.23}N$ (2 nm) MQB has quantum-mechanical effects so as to stop electrons having energy levels higher than the barrier height. Thus, electrons having energy levels higher than the barrier height can be blocked by making use of multiquantum MQB effects upon electrons. The present inventors found that the use of an MQB allows blocking of electrons having higher energy levels than those blocked using an SQB. In particular, for InAlGaN-based ultraviolet elements, AlGaN having the composition similar to that of AlN is used; however, it is difficult to realize a barrier having the barrier height exceeding that of AlN. Therefore, MQB effects are very important. Accordingly, it becomes possible to provide element technology for further improving deep UV light emission intensity using, as a light-emitting layer material, an AlGaInN-based material and, in particular, an AlGaN-based material.

11 Claims, 25 Drawing Sheets

(56) References Cited

U.S. PATENT DOCUMENTS

| | | | |
|---|---|---|---|
| 6,521,917 B1 * | 2/2003 | Takayama et al. | 257/103 |
| 7,811,847 B2 | 10/2010 | Hirayama et al. | |
| 2001/0030317 A1 * | 10/2001 | Lee et al. | 257/13 |
| 2007/0290230 A1 | 12/2007 | Kawaguchi et al. | |
| 2009/0057646 A1 | 3/2009 | Hirayama et al. | |

FOREIGN PATENT DOCUMENTS

| | | |
|---|---|---|
| JP | 11-243251 A | 9/1999 |
| JP | 2001-223441 A | 8/2001 |
| JP | 2002-540638 A | 11/2002 |
| JP | 2004-095724 | 3/2004 |
| JP | 3909605 B2 | 4/2007 |
| JP | 2008-300886 A | 12/2008 |
| JP | 2009-54780 A | 3/2009 |
| JP | 2009130097 A | 6/2009 |
| JP | 2010-28057 A | 2/2010 |
| WO | 2005/034301 A1 | 4/2005 |

OTHER PUBLICATIONS

Korean Office Action dated Oct. 17, 2013 issued in Korean Patent Application No. 10-2012-7024827.

Korean Office Action issued Feb. 23, 2014 in Korean Patent Application No. 10-2012-7024827.

Communication from the Japanese Patent Office issued Dec. 2, 2014 in a counterpart Japanese Patent Application No. 2012-501649.

Japanese Office Action issued Apr. 15, 2015 in Japanese Patent Application No. 2012-501649.

* cited by examiner

FIG. 1B

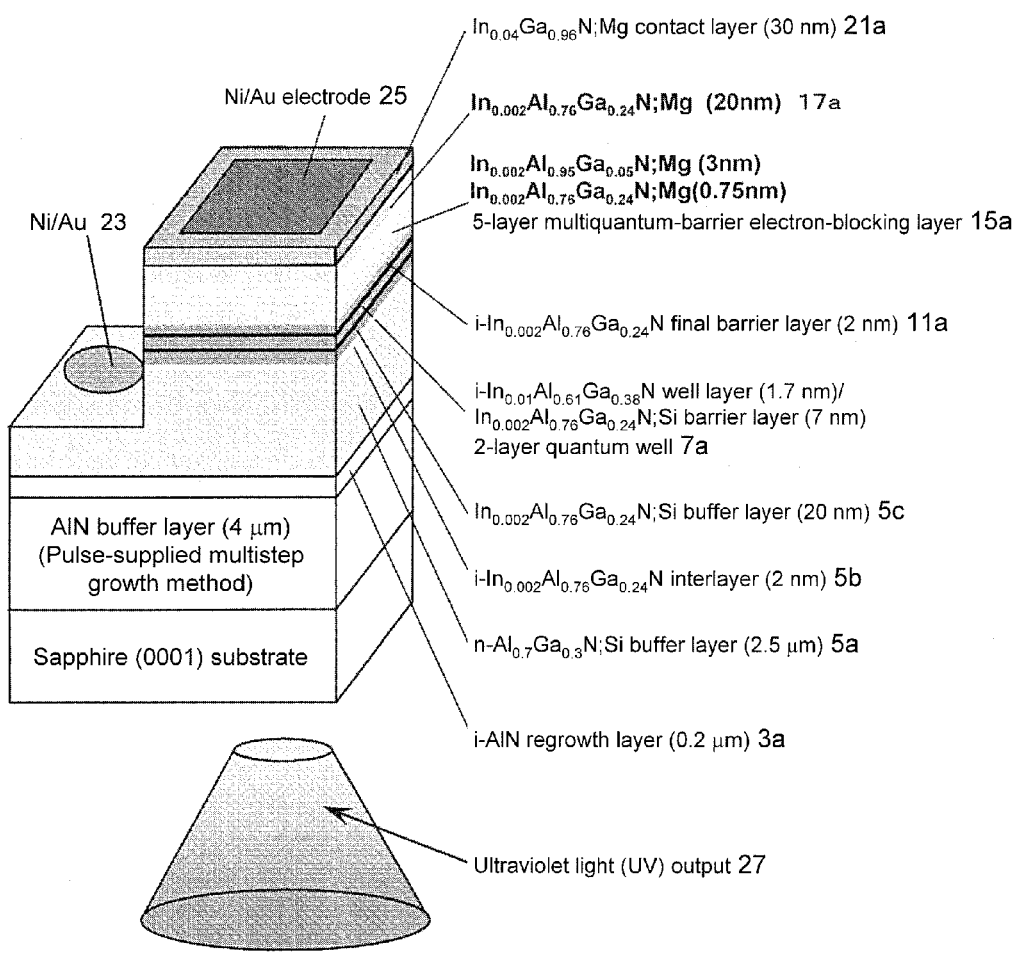

- $In_{0.04}Ga_{0.96}N;Mg$ contact layer (30 nm) 21a
- $In_{0.002}Al_{0.76}Ga_{0.24}N;Mg$ (20nm) 17a
- $In_{0.002}Al_{0.95}Ga_{0.05}N;Mg$ (3nm)
  $In_{0.002}Al_{0.76}Ga_{0.24}N;Mg$ (0.75nm)
  5-layer multiquantum-barrier electron-blocking layer 15a
- i-$In_{0.002}Al_{0.76}Ga_{0.24}N$ final barrier layer (2 nm) 11a
- i-$In_{0.01}Al_{0.61}Ga_{0.38}N$ well layer (1.7 nm)/
  $In_{0.002}Al_{0.76}Ga_{0.24}N;Si$ barrier layer (7 nm)
  2-layer quantum well 7a
- $In_{0.002}Al_{0.76}Ga_{0.24}N;Si$ buffer layer (20 nm) 5c
- i-$In_{0.002}Al_{0.76}Ga_{0.24}N$ interlayer (2 nm) 5b
- n-$Al_{0.7}Ga_{0.3}N;Si$ buffer layer (2.5 μm) 5a
- i-AlN regrowth layer (0.2 μm) 3a Ni/Au electrode 25
Ni/Au 23
AlN buffer layer (4 μm)
(Pulse-supplied multistep growth method)
Sapphire (0001) substrate Ultraviolet light (UV) output 27

Operation spectrum (room temperature CW operation)
AlGaN UV LEDs with multiquantum barrier (MQB) (wavelength: 250-262 nm)

(a)

(b)

(a)

A-plane-grown (non-polar)
270-nm band LED
Al composition for
Well/Barrier/MQB:
50%/70%/95%

(b)

A-plane-grown (non-polar)
230-nm band LED
Al composition for
Well/Barrier/MQB:
75%/85%/95%

(c)

C-plane-grown (polar)
270-nm band LED
Al composition for
Well/Barrier/MQB:
50%/70%/95%

(d)

C-plane-grown (polar)
230-nm band LED
Al composition for
Well/Barrier/MQB:
75%/85%/95%

LIGHT-EMITTING ELEMENT HAVING NITRIDE SEMICONDUCTOR MULTIQUANTUM BARRIER, AND PROCESS FOR PRODUCTION THEREOF

CROSS REFERENCE TO RELATED APPLICATIONS

This application is a Continuation of U.S. patent application Ser. No. 13/580,868, which is a National Stage of International Application No. PCT/JP2010/071524, filed on Nov. 25, 2010, which claims priority from Japanese Patent Application No. 2010-038912, filed on Feb. 24, 2010, the contents of all of which are incorporated herein by reference in their entirety.

TECHNICAL FIELD

The present invention relates to nitride semiconductor light-emitting element technology and particularly relates to high-efficiency technology for AlGaN deep-ultraviolet (UV) light-emitting elements with an MQB and the like.

BACKGROUND ART

In recent years, nitride semiconductors containing nitrogen as a group V element have been in the limelight in the field of semiconductor light-emitting elements utilizing pn junction, such as light-emitting diodes (LEDs) and laser diodes (LDs), and have been researched and developed. The nitride semiconductors such as AlN, GaN, and InN are direct transition semiconductors. Moreover, nitride semiconductors of ternary mixed crystal type or quaternary mixed crystal type can emit light from infrared light to deep UV light by appropriately setting composition to vary a band gap. In particular, since the UV range is an unexplored light range, further research and development of such nitride semiconductors have been expected.

Wide applications of semiconductor deep UV light sources (LEDs/LDs) with wavelengths of 220 to 350 nm for sterilization/water purification, in the field of the medical/biochemical industries, and the like are expected for the future. The achievement of such applications has been awaited. In addition, such light sources can be used in a wide range of applications for high-density optical recording light sources, white illumination lamps, UV-curable resins, and the like for industrial use, sensing technology such as fluorescence analysis, high-speed decomposition processing of environmentally hazardous substances (e.g., dioxin, endocrine disrupters, and PCB) with the combined use with titanium oxide, and the like. The above light sources are known to have sterilization effects that can be intensified to a maximum at wavelengths of about 260-280 nm overlapping the DNA absorption wavelength. The market size for semiconductor UV light sources is expected to exponentially expand with progress in high efficiency technology. Thus, development of high-efficiency/high-power UV LEDs/LDs is an important subject.

Conventional UV light sources are limited to gas-solid UV light sources such as excimer lasers, argon ion SHG lasers, and excimer lamps. Since they are large-size, short-life, and expensive UV light sources, applications thereof for general purposes have been difficult. If semiconductor UV LEDs/LDs that can replace conventional UV light sources are realized, they will serve as ultracompact, high-efficiency, high-power, long-life, and low-cost UV light sources, compared with gas-solid light sources, leading to the opening of a wide range of application fields. Such semiconductor UV LEDs/LDs will be in high demand in such application fields. Thus, the development of nitride AlGaN-based deep UV light sources is particularly important for the future.

AlGaN-based materials can be selected as materials for realization of UV light-emitting elements. The band gap energy for AlGaN-based materials ranges from 3.4 eV for GaN to 6.2 eV for AlN; such range covers the UV light-emitting regions of various conventionally used gas lasers. In addition, AlGaN-based materials have, for example, the following features: 1) they are direct transition-type semiconductors throughout the entire composition range; 2) they allow high-efficiency UV light emission from quantum wells; 3) p- or n-type semiconductors can be formed with them; 4) they are rigid materials with long element lives; and 5) they are environmentally safe materials free from harmful substances such as arsenic, mercury, and lead. Due to the above reasons, AlGaN-based materials are most promising materials for realization of practical UV light-emitting elements.

As a result of the development of AlGaN-based UV light-emitting devices over roughly the past 15 years, there has been progress; however, the efficiency thereof currently remains at about 1%, which is lower than that of blue LEDs (80% or higher) and the like under the present circumstances. Reduction of the threading dislocation density in an AlN underlayer was a key factor for realization of UV LEDs. In recent years, however, the dislocation density has been reduced to about $1/100$ that the previous level, resulting in the improvement of internal quantum efficiency from 0.5% or less to about 50% for 220- to 320-nm AlGaN. Further, the internal quantum efficiency has been improved to about 80% by mixing In in with AlGaN (see, e.g., Patent Literature 1).

Nevertheless, the p-type concentration in AlGaN is still low, causing the efficiency for electron injection into a light-emitting layer to remain at a low level of about 10% to 30%. In addition, the light extraction efficiency for UV LEDs is as low as 6% to 8% due to UV light absorption in the vicinity of a contact layer/electrode. The external quantum efficiency for UV LEDs determined by multiplying the above factors is as low as about 1%, which should be improved in future research.

In particular, it has been long believed that achievement of high electron injection efficiency would be impossible because p-type AlGaN has limited physical properties, making it impossible to improve the hole concentration of p-type AlGaN. For the present invention, the present inventors introduced multiquantum-barrier electron-blocking layers into AlGaN- or InAlGaN-based UV LEDs, thereby successfully improving the electron injection efficiency from 10%-30% to an estimated level of 80% or more by experiment. Accordingly, the present inventors have suggested and demonstrated a method for solving fundamental problems associated with electron injection, which are derived from the "impossibility derived from p-type AlGaN." The disclosure of the present application relates to the introduction of multiquantum-barrier electron-blocking layers for the improvement of electron injection efficiency for nitride UV light-emitting elements and teaches standards for designing multiquantum-barrier electron-blocking layers, analytical values of the actual effects of such introduction, practical implementation of the present invention for deep UV LEDs, and realization of the world's highest output.

CITATION LIST

Patent Literature

Patent Literature 1: JP Patent Publication (Kokai) No. 9-64477 A (1997)

SUMMARY OF INVENTION

Technical Problem

The external quantum efficiency for 220- to 360-nm AlGaN- or InAlGaN-based deep UV LEDs is still lower than that for blue LEDs (80% or higher). To date, the external quantum efficiency has reached about 7%, 1%, and 0.1%-0.5% for 340- to 350-nm, 260- to 280-nm, and 230- to 250-nm AlGaN- or InAlGaN-based deep UV LEDs, respectively. The external quantum efficiency (EQE: External Quantum Efficiency) of UV LEDs is expressed by the following formula.

$$\eta_{ext} = \eta_{int}\text{(internal quantum efficiency)} \times \eta_{lee}\text{(light extraction efficiency)} \times \eta_{inj}\text{(electron injection efficiency)}$$

As a result of past research and development, the internal quantum efficiency (IQE: Internal Quantum Efficiency) for UV light emission from AlGaN-based quantum wells has been remarkably improved. The IQE level has recently reached 80% or higher. Unlike InGaN materials used for blue LEDs, threading dislocations in AlGaN significantly reduce light-emitting efficiency. In a case in which a conventional AlN buffer layer having a high threading dislocation density was used, the obtained IQE was as low as 0.5% or less. However, as a result of reduction of the threading dislocation density in an AlN buffer layer, IQE for UV light emission from AlGaN-based quantum wells has been significantly improved and has reached about 50%. Further, the IQE has been improved to about 80% with the addition of In (about 0.3%) to AlGaN. Problems associated with internal quantum efficiency for AlGaN-based UV light-emitting elements have been solved in past development.

However, the electron injection efficiency (EIE: Electron Injection Efficiency) for electron injection into a light-emitting layer and the light extraction efficiency (LEE: Light Extraction Efficiency) for UV LEDs remain at low levels of 10% to 30% and 6% to 8%, respectively. The external quantum efficiency for UV LEDs determined by multiplying these factors is as low as about 1%, which must be improved in future research.

Low light extraction efficiency (LEE) is derived from UV light absorption in the vicinity of a contact layer/electrode and low optical reflectance of a p-type electrode. In the future, LEE will be improved through the improvement of electrode reflectance, the introduction of Al reflection boards and two-dimensional photonic crystal structures, etc.

Meanwhile, low electron injection efficiency (EIE) is derived from low hole concentration of p-type AlGaN, which is determined based on physical properties of AlGaN that result in deep Mg acceptor levels. This makes it difficult to improve EIE. The hole concentration in AlGaN is $10^{16}$ cm$^{-3}$ or less at an Al composition of 50% to 70% and $10^{14}$ cm$^{-3}$ or less at an Al composition of 70% to 90%, which is remarkably lower than about $5 \times 10^{17}$ cm$^{-3}$ for general pn junction devices. Accordingly, electrons are not injected into a light-emitting region and leak into the p-side layer, resulting in reduction of electron injection efficiency for AlGaN UV LEDs. The electron injection efficiency has been improved to a certain extent using electron-blocking layers. However, even though AlN having a large band gap or AlGaN with an Al composition of 95% or more has been selected as a material for an electron-blocking layer in order to maximize the electron barrier height, sufficient electron injection efficiency has not yet been achieved. Estimated values of electron injection efficiency (EIE) are about 30%, 10% to 30%, and 10% or less for 260- to 280-nm, 240- to 260-nm, and 220- to 240-nm AlGaN quantum well LEDs, respectively.

An object of the present invention is to provide element technology for further improving deep UV light emission intensity using, as a light-emitting layer material, an AlGaInN-based material and, in particular, an AlGaN-based material.

Solution to Problem

As described above, it has been considered that physical properties of p-type AlGaN, AlN, and the like and the limitations of bulk structures make it difficult to achieve high electron injection efficiency. According to the present invention, the following is suggested: a process for remarkably improving the efficiency of a nitride UV light-emitting element by obtaining effects exceeding the above physical limitations with the use of a multiquantum barrier for an electron-blocking layer.

A barrier height several times greater than the electron barrier height determined based on the band gap for a bulk crystal can be achieved by making use of quantum-mechanical multiple electron reflection effects. By making use of such effects, electron injection efficiency can be improved from a conventional level of 10% to 30% to 80% to 100%. Fundamental problems associated with electron injection efficiency, which have been difficult to solve because of low hole concentrations of p-type semiconductors, can be solved by the above process.

Efficiency of AlGaN- and InAlGaN-based UV LEDs can be remarkably improved by the process of the present invention. In addition, the process of the present invention will be significantly effective for realization of AlGaN-based UV LDs that are planned be developed. The electron injection efficiency described above sharply decreases as the injected current density increases. In particular, the injected current density for operation of LDs is about 10 to 100 times that for operation of LEDs. Thus, electron injection efficiency (EIE) for LDs can be expected to further decrease to a level about $\frac{1}{10}$ that of LEDs. Therefore, it would be very difficult to realize 250- to 330-nm UV LDs due to low hole concentrations and insufficient electron barrier heights. Such difficulties prevent realization of 250- to 330-nm UV LDs.

However, the use of the nitride semiconductor multiquantum barrier of the present invention allows the improvement of electron injection efficiency estimated at 10% or less for UV LDs to a level of 50% to 100%, which will make it possible to realize 250- to 330-nm UV LDs for the first time.

As described above, nitride semiconductor multiquantum barriers have an immeasurable impact on the improvement of UV light-emitting element efficiency. In addition, as a result of the advent of high-efficiency 220- to 390-nm UV LEDs and UV LDs, for which high-efficiency operation has been realized using nitride semiconductor multiquantum barriers, the field of applications of UV semiconductor light-emitting elements will remarkably expand.

Similar MQB effects can be applied to 390- to 550-nm near-UV, purple, blue, or green light-emitting LDs and LEDs, and thus remarkable effects can be expected. The process of the present invention is very important as a way to significantly improve decline (droop) of efficiency during high-power operation, which is particularly problematic for blue LEDs.

In one aspect of the present invention, the following is provided: a nitride semiconductor light-emitting element that emits light at a wavelength of 220 to 390 nm, comprising: an $Al_xGa_{1-x}N$ ($0<x<1$) buffer layer formed on a substrate; an n-type $In_xAl_yGa_{1-x-y}N$ ($0<x<0.1$, $0<y<1$) layer formed on the $Al_xGa_{1-x}N$ buffer layer; a quantum-well light-emitting layer comprising an $In_{x1}Al_{y1}Ga_{1-x1-y1}N$ ($0<x1<0.5$, $0<y1<1$) quantum well layer and an $In_{x2}Al_{y2}Ga_{1-x2-y2}N$ ($0<x2<0.3$, $0<y2<1$, $x1>x2$, $y1<y2$) barrier layer formed on the n-type InAlGaN layer; a p-type $In_xAl_yGa_{1-x-y}N$ ($0<x<0.1$, $0<y<1$) layer formed on the InAlGaN quantum-well light-emitting layer; and a multiquantum-barrier electron-blocking layer formed on the p-type InAlGaN layer.

In addition, preferably, the multiquantum-barrier electron-blocking layer formed on the p-type InAlGaN layer comprises a plurality of pairs of an $In_{x1}Al_{y1}Ga_{1-x1-y1}N$ ($0<x1<0.1$, $0<y1<1$) barrier layer and an $In_{x2}Al_{y2}Ga_{1-x2-y2}N$ ($0<x2<0.3$, $0<y2<1$, $x1<x2$, $y1>y2$) valley layer, provided that a 1st pair of layers and the 2nd pair of layers are spaced apart, the layer thickness of the 1st pair of layers is greater or less than the layer thickness of the 2nd pair of layers, and the 1st pair of layers and the 2nd pair of layers are arranged in that order from the quantum-well light-emitting layer side to the side opposite the substrate.

The above description is explained with reference to, for example, FIG. 11. The expression "a pair of an $In_{x1}Al_{y1}Ga_{1-x1-y1}N$ ($0<x1<0.1$, $0<y1<1$) barrier layer and an $In_{x2}Al_{y2}Ga_{1-x2-y2}N$ ($0<x2<0.3$, $0<y2<1$, $x1<x2$, $y1>y2$) valley layer" means, for example, a pair of a 2 ML barrier layer and a 2 ML valley layer for an MQB. In the case of FIG. 11, such pair is formed only for 8 periods.

In addition, the phrase "the 2nd pair of layers" means a pair of layers having the layer thickness different from that of the 1st pair of layers. For example, if the 1st pair of layers is a pair of the 2 ML/2 ML layers in FIG. 11, the 2nd pair of layers is a pair of the 3 ML/3 ML layers in FIG. 11. They are formed spaced apart.

In FIG. 11 (a), the layer thickness of the 1st pair of layers is smaller than that of the 2nd pair of layers, and the 1st pair of layers and the 2nd pair of layers are formed in that order from the quantum-well light-emitting layer side to the side opposite the substrate in an MQB. Meanwhile, in FIG. 11 (b), the layer thickness of the 1st pair of layers is larger than that of the 2nd pair of layers, and the 1st pair of layers and the 2nd pair of layers are formed in that order from the quantum-well light-emitting layer side to the side opposite the substrate.

In addition, preferably, the multiquantum-barrier electron-blocking layer formed on the p-type InAlGaN layer comprises a plurality of pairs of an $In_{x1}Al_{y1}Ga_{1-x1-y1}N$ ($0<x1<0.1$, $0<y1<1$) barrier layer and an $In_{x2}Al_{y2}Ga_{1-x2-y2}N$ ($0<x2<0.3$, $0<y2<1$, $x1<x2$, $y1>y2$) valley layer, provided that a 1st pair of layers, a 2nd pair of layers, and a 3rd pair of layers are spaced at intervals (note that: the layer thickness of the 1st pair of layers is greater than the layer thickness of the 2nd pair of layers and the layer thickness of the 2nd pair of layers is greater than the layer thickness of the 3rd pair of layers; or the layer thickness of the 1st pair of layers is less than the layer thickness of the 2nd pair of layers and the layer thickness of the 2nd pair of layers is less than the layer thickness of the 3rd pair of layers), and the 1st, 2nd, and 3rd pairs of layers are provided in that order from the quantum-well light-emitting layer side to the side opposite the substrate.

Basically, the above description indicates that the 3rd pair of layers, for example, a pair of the 4 ML/4 ML layers is provided, as well as the 1st pair of layers and the 2nd pair of layers.

Here, the 2nd pair of the 3 ML/3 ML layers and the 3rd pair of the 4 ML/4 ML layers may be adjacent to or spaced apart. In the above case, the 2nd pair is spaced apart from the 3rd pair.

In addition, FIG. 11 shows an example of a combination of the 1st to 4th pairs of layers with different thicknesses. In this case, the 1st pair of layers, the 2nd pair of layers, and the 3rd pair of layers might not be provided in a manner such that they are spaced at intervals. In practice, the scope of the present invention encompasses embodiments in which more different types of pairs of layers, for example, at least 5 pairs of layers with different thicknesses are provided, compared with the example shown in FIG. 11. In such case, it can be said that the 1st pair of layers, the 2nd pair of layers, and the 3rd pair of layers are spaced at intervals.

The multi-layer number of barrier layers and that of valley layers of the pair of layers may be the same. This indicates that they may be the same so that a pair of the 2 ML/2 ML layers is formed for 8 periods as shown in FIG. 11.

The nitride semiconductor UV light-emitting element is preferably a light-emitting diode.

The multiquantum-barrier electron-blocking layer is formed by alternately layering $In_{x1}Al_{y1}Ga_{1-x1-y1}N$ ($0<x1<0.1$, $0<y1<1$) barrier layers and $In_{x2}Al_{y2}Ga_{1-x2-y2}N$ ($0<x2<0.3$, $0<y2<1$, $x1<x2$, $y1>y2$) valley layers for the same number of periods or a 1st number of periods and a 2nd number of periods that differs from the 1st number of periods.

In addition, according to the present invention, a near-ultraviolet, purple, blue, or green nitride semiconductor light-emitting element with a MQB may be a near-ultraviolet, purple, blue, or green nitride semiconductor light-emitting element that emits light at a wavelength of 390 to 550 nm, comprising: an AlxGa1-xN ($0<x<1$) buffer layer formed on a substrate; an n-type $In_xAl_yGa_{1-x-y}N$ ($0<x<0.1$, $0<y<1$) layer formed on the $Al_xGa_{1-x}N$ buffer layer; a quantum-well light-emitting layer comprising an $In_{x1}Al_{y1}Ga_{1-x1-y1}N$ ($0<x1<0.5$, $0<y1<1$) quantum well layer and an $In_{x2}Al_{y2}Ga_{1-x2-y2}N$ ($0<x2<0.3$, $0<y2<1$, $x1>x2$, $y1<y2$) barrier layer formed on the n-type InAlGaN layer; a p-type $In_xAl_yGa_{1-x-y}N$ ($0<x<0.1$, $0<y<1$) layer formed on the InAlGaN quantum-well light-emitting layer; and a multiquantum-barrier electron-blocking layer formed on the p-type InAlGaN layer, wherein the multiquantum-barrier electron-blocking layer is formed by alternately layering $In_{x1}Al_{y1}Ga_{1-x1-y1}N$ ($0<x1<0.1$, $0<y1<1$) barrier layers and $In_{x2}Al_{y2}Ga_{1-x2-y2}N$ ($0<x2<0.3$, $0<y2<1$, $x1<x2$, $y1>y2$) valley layers for a given number of periods or a 1st number of periods and a 2nd number of periods that differs from the 1st number of periods.

The nitride semiconductor light-emitting element is characterized in that the number of periods increases or decreases in a stepwise manner from the active layer side to the multiquantum-barrier electron-blocking layer side.

In a case in which the multiquantum-barrier electron-blocking layer is a non-polar layer, specifically, the multiquantum-barrier electron-blocking layer is a non-polar layer formed on an A-plane or M-plane or a layer formed on a semipolar plane. An A-plane and an M-plane are well-known polar planes for nitride semiconductors.

In another aspect of the present invention, the following is provided: a process for growing a light-emitting element structure on a group-III nitride single crystal, comprising the steps of: growing an $Al_xGa1-xN$ ($0<x<1$) buffer layer on a substrate; growing an n-type $In_xAl_yGa_{1-x-y}N$ ($0<x<0.1$, $0<y<1$) layer on the $Al_xGa_{1-x}N$ buffer layer; growing a quantum-well light-emitting layer comprising an $In_{x1}Al_{y1}Ga_{1-x1-y1}N$ ($0<x1<0.5$, $0<y1<1$) quantum well layer and an $In_{x2}Al_{y2}Ga_{1-x2-y2}N$ ($0<x2<0.3$, $0<y2<1$, $x1>x2$, $y1<y2$) barrier layer on the n-type InAlGaN layer; growing a p-type $In_xAl_yGa_{1-x-y}N$ ($0<x<0.1$, $0<y<1$) layer on the InAlGaN light-emitting layer; and growing a multiquantum-barrier electron-blocking layer by alternately layering $In_{x1}Al_{y1}Ga_{1-x1-y1}N$ ($0<x1<0.1$, $0<y1<1$) barrier layers and $In_{x2}Al_{y2}Ga_{1-x2-y2}N$ ($0<x2<0.1$, $0<y2<1$, $x1<x2$, $y1>y2$) valley layers on the p-type InAlGaN layer.

This description includes part or all of the contents as disclosed in the description and/or drawings of Japanese Patent Application No. 2010-038912, which is a priority document of the present application.

Advantageous Effects of Invention

The use of MQB results in electron blocking effects greater than those obtained with the use of a single barrier. In addition, the higher the barrier height and/or the longer the MQB period, the better the electron blocking effects in the case of either an A-plane-grown polar crystal or a C-plane-grown polar crystal.

Moreover, electron blocking can be achieved for a wide range of energy levels with the use of MQB by changing MQB periods alternately. Thus, electron blocking effects obviously greater than those obtained with MQB with the same number of periods can be achieved.

BRIEF DESCRIPTION OF DRAWINGS

FIG. 1B is a perspective view of a configuration example of an AlGaN/InAlGaN UV LED (280 nm band) with a multi-quantum well barrier in one embodiment of the present invention.

FIGS. 13A and 13B).

REFERENCE SIGNS LIST

A: 250 nm UV LED; 1: sapphire substrate; 3: multiquantum AlN buffer layer; 5: n-$Al_{0.77}Ga_{0.23}N$; Si buffer layer; 7: 3-layer $Al_{0.62}Ga_{0.38}N$ (1.5 nm)/$Al_{0.77}Ga_{0.23}N$ (6 nm) multi-quantum-well light-emitting layer (MQW); 11: Mg-doped p-$Al_{0.77}Ga_{0.23}N$ layer; 15: 5-layer $Al_{0.95}Ga_{0.05}N$ (4 nm)/$Al_{0.77}Ga_{0.23}N$ (2 nm) multiquantum barrier electron-blocking layer (MQB); 17: p-$Al_{0.77}Ga_{0.23}N$ layer; 21: Mg-doped p-GaN contact layer; 23: Ni/Au n-type electrode; 25: Ni/Au p-type electrode; 27: UV output.

DESCRIPTION OF EMBODIMENTS

Figure 1A:
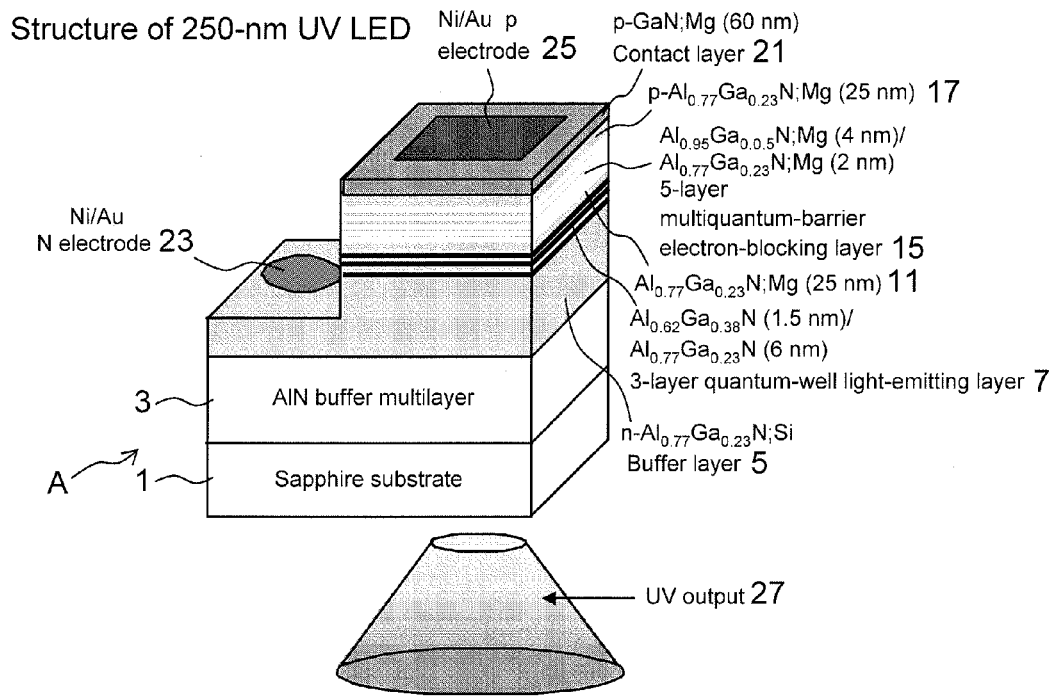
FIG. 1A is a perspective view of a configuration example of an AlGaN/InAlGaN UV LED (250 nm band) with a multi-quantum well barrier in one embodiment of the present invention.

The deep-UV light-emitting elements (LEDs) obtained in embodiments of the present invention are described below with reference to the drawings. FIG. 1A is a perspective view of a configuration example of an AlGaN UV LED with a multiquantum well barrier in one embodiment of the present invention. As shown in FIG. 1A, a 250 nm UV LED (A) is formed on a sapphire substrate 1 and comprises a multi-layer AlN buffer layer 3 with reduced threading dislocations, an n-$Al_{0.77}Ga_{0.23}N$; Si buffer layer 5, a 3-layer $Al_{0.62}Ga_{0.38}N$ (1.5 nm)/$Al_{0.77}Ga_{0.23}N$ (6 nm) multiquantum-well light-emitting layer 7 (MQW), an Mg-doped p-$Al_{0.77}Ga_{0.23}N$ layer 11 (25 nm), a 5-layer $Al_{0.95}Ga_{0.05}N$ (4 nm)/$Al_{0.77}Ga_{0.23}N$ (2 nm) multiquantum-barrier electron-blocking layer 15 (MQB), a p-$Al_{0.77}Ga_{0.23}N$ layer 17 (25 nm), an Mg-doped p-GaN contact layer 21, an Ni/Au n-type electrode 23, and an Ni/Au p-type electrode 25. A UV output 27 from the sapphire substrate face side is obtained when a given voltage is applied between electrodes thereof.

FIG. 1B is a perspective view of a configuration example of an InAlGaN UV LED with a multiquantum well barrier in one embodiment of the present invention. As shown in FIG. 1B, a 280-nm UV LED is formed on a sapphire substrate 1 and comprises an i-AlN regrowth layer (0.2 μm) 3a, a multiquantum $Al_{0.7}Ga_{0.3}N$ buffer layer 5a with reduced threading dislocations, an n-$In_{0.002}Al_{0.76}Ga0.24N$ interlayer 5b (2 nm), an $In_{0.002}Ga_{0.76}Ga_{0.24}N$ (20 nm) buffer layer 5c, a 2-layer i-$In_{0.01}Al_{0.61}Ga_{0.38}N$ (well layer) (1.7 nm)/ $In_{0.002}Al_{0.76}Ga_{0.24}N$; Si (barrier layer) (7 nm) multiquantum-well light-emitting layer (MQW) 7a, an Mg-doped p-$In_{0.002}Al_{0.76}Ga_{0.24}N$ layer 11a (2 nm), a 5-layer $In_{0.002}Al_{0.95}Ga_{0.05}N$; Mg (3 nm)/$In_{0.002}Al_{0.76}Ga_{0.24}N$ (0.75 nm) multiquantum-barrier electron-blocking layer 15a (MQB), a p-$In_{0.002}Al_{0.76}Ga_{0.24}N$ layer 17a (20 nm), an Mg-doped p-$In_{0.04}Ga_{0.96}N$; Mg contact layer 21a, an Ni/Au n-type electrode 23, and an Ni/Au p-type electrode 25. A UV output 27 from the sapphire substrate face side is obtained when a given voltage is applied between electrodes thereof.

Mixing of a minute amount of In in with AlGaN results in very important effects for realizing high-efficiency UV LEDs. Mixing of In in with an AlGaN light-emitting layer (In: about 0.3%) results in enhancement of internal quantum efficiency (IQE) for quantum wells that emit light at 280 nm. The internal quantum efficiency was improved to 80% or higher at maximum, although it had been about 30% without the mixing of In. This is probably because modulation of the In composition in AlGaN causes localization of injected carriers so that the carriers are trapped in a crystal defect region and thus radiative recombination takes place before non-radiative recombination, which is effective for the improvement of light-emitting efficiency. Such improvement effect has been achieved by mixing In (about 2%-5%) with AlGaN for 340-nm light-emitting quantum wells. For 220- to 390-nm AlGaN quantum wells, high IQE can be expected to be achieved by mixing In (0.1%-10% of the quantum well region). In addition, the hole concentration of p-type InAlGaN has been found to be higher than that of p-type AlGaN. As a result, high-efficiency operation of 280- to 350-nm UV LEDs has been achieved. InAlGaN-based UV LEDs, as well as UV LEDs formed with AlGaN alone, are highly important for achievement of high-efficiency operation.

Figure 2:
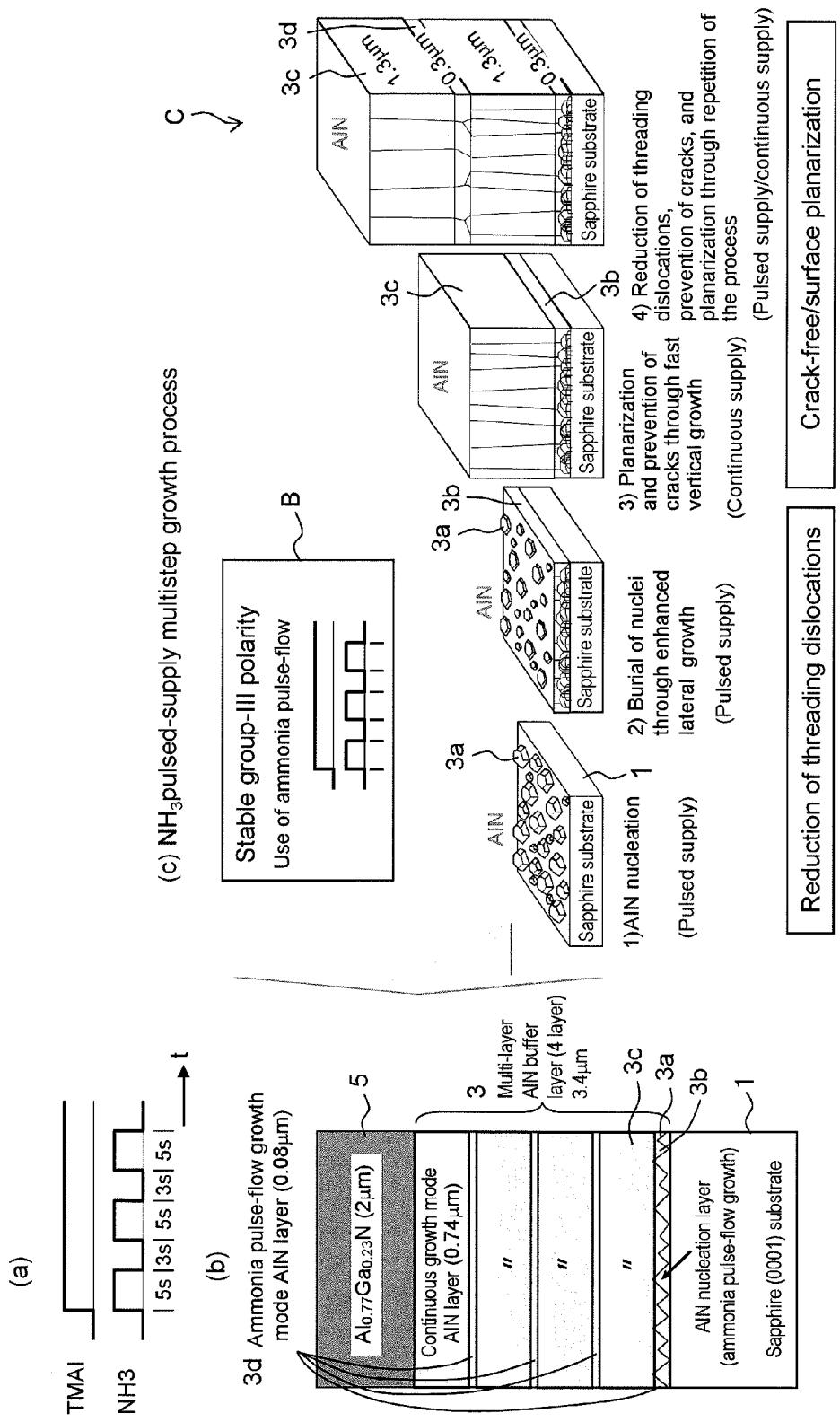
FIG. 2 shows an example of an LED structure having an AlGaN/AlN buffer layer structure.

FIG. 2 shows an example of a buffer portion of an LED structure having an AlGaN/AlN buffer layer structure. When a conventional AlGaN-based buffer with a high threading dislocation density (edge dislocation density: about $2 \times 10^{10}$ $cm^{-2}$) is used, internal quantum efficiency (IQE) upon UV light emission for AlGaN-based quantum wells decreases to a low level of 0.5% or less. In order to realize a nitride semiconductor UV light-emitting element, it is necessary to use, in particular, an AlGaN-based buffer with a low threading dislocation density. When the threading dislocation density is about $1 \times 10^9$ $cm^{-2}$, the IQE for AlGaN quantum wells can reach about 30%. In order to achieve high-efficiency operation of AlGaN-based UV LEDs, it is desirable to realize an edge dislocation density of $3 \times 10^8$ $cm^{-2}$ or less. It is difficult to form an AlN crystal with a low threading dislocation density on a sapphire substrate because of significant differences in crystal lattice spacing between AlN and sapphire. In order to supply an AlN/AlGaN buffer useful for an AlGaN-based electron/optical device, it is essential to create a process for production thereof that allows the following: 1) reduction of threading dislocations; 2) prevention of cracks; 3) atomic layer flatness; and 4) stable group III polarity. FIG. 2 shows a process for producing an AlN buffer on a sapphire substrate by an "ammonia pulsed-supply multistep growth method" created as a process that satisfies the above conditions 1) to 4).

First, AlN nucleation 3a is induced on a sapphire substrate 1 by the ammonia pulsed-supply method (FIG. 2, (c), left side). Subsequently, burial of nuclei 3b is carried out through enhanced lateral growth (pulsed-supply), followed by planarization through fast vertical growth and prevention of cracks (continuous supply) 3c. Further, planarization (pulsed supply/continuous supply; FIG. 2, (c), right side) growth 3d is carried out to prevent threading dislocations by repeating the above steps. By doing so, a high-quality AlN buffer layer can be realized by the $NH_3$ pulsed-supply multistep growth method, allowing reduction of threading dislocations and crack-free surface planarization. A chart (a) shown in the upper left of FIG. 2 shows an ammonia pulse-flow method using TMAl and $NH_3$. For example, TMAl and $NH_3$ are supplied to grow an AlN-based material by MOCVD (metal organic CVD). By continuously supplying TMAl and supplying $NH_3$ in a pulsed manner, growth of high-quality AlN through material migration enhanced growth and group-III rich growth can be carried out, and at the same time, stable group-III polarity can be realized.

As shown in FIG. 2, an edge dislocation density of $3 \times 10^8$ $cm^{-2}$ has been achieved by forming an AlN nucleation layer and a multiquantum AlN buffer comprising 4 layers. An internal quantum efficiency of 30% or higher upon UV light emission has been achieved by creating an AlGaN quantum well LED thereon.

TABLE 1

Examples of crystal growth conditions for MOCVD growth of each layer of 250-nm AlGaN structure with MQB

|  | AlN1 | AlN2 | AlN3 | AlGaN1 | AlGaN2 |
|---|---|---|---|---|---|
| Growth layer | Nucleation layer | Burying layer | Continuous growth layer | Barrier layer | MQB barrier layer |
| Composition | AlN | AlN | AlN | Al0.77Ga0.23N | Al0.95Ga0.05N |
| Gas supply type | NH3 pulsed-supply | NH3 pulsed-supply | Continuous supply | Continuous supply | Continuous supply |
| Growth temperature | 1300° C. | 1200° C. | 1200° C. | 1120° C. | 1120° C. |
| Growth pressure | 200 Torr | 76 Torr | 76 Torr | 76 Torr | 76 Torr |
| Growth rate | — | 0.6 μm/h | 6 μm/h | 1.5 μm/h | 1.5 μm/h |
| TMAl flow rate | 12 sccm | 15 sccm | 50 sccm | 40 sccm | 50 sccm |
| TAGa flow rate | 0 | 0 | 0 | 5 sccm | 1 sccm |

TABLE 1-continued

Examples of crystal growth conditions for MOCVD growth
of each layer of 250-nm AlGaN structure with MQB

|  | AlN1 | AlN2 | AlN3 | AlGaN1 | AlGaN2 |
|---|---|---|---|---|---|
| NH3 flow rate | 30 Sccm | 500 Sccm | 100 Sccm | 2SLM | 2SLM |
| V/III ratio | 60 | 750 | 23 | 900 | 900 |

Table 1 shows examples of crystal growth conditions for MOCVD growth of each layer of a 250-nm AlGaN structure comprising an MQB. Among growth layers, AlN1 corresponds to a nucleation layer, AlN2 corresponds to a burying layer, AlN3 corresponds to a continuous growth layer, AlGaN1 corresponds to a barrier layer, and AlGaN2 corresponds to an MQB barrier layer.

Table 1 shows examples of MOCVD growth conditions used herein for a nucleation layer (3a) (ammonia pulse-flow growth; growth condition: AlN1), a burying layer (3b) (ammonia pulse-flow growth; growth condition: AlN2), and continuous growth layer (3c) (growth condition: AlN3) of an MN buffer formed by "the ammonia pulsed-supply multistep growth method." Table 1 also shows a barrier layer (growth condition: AlGaN1) and an MQB barrier layer (growth condition: AlGaN2) for the 250-nm AlGaN quantum well LED.

Next, characteristics of UV (deep UV) light-emitting elements are described.

TABLE 2

Al composition, maximum LED external quantum efficiency
(EQEUV), and LED output of each AlGaN layer of 250-
to 260-nm AlGaN quantum well LED with MQB

| Wavelength | Quantum well layer | Buffer and barrier layer | MQB layer | Maximum EQE | Maximum output |
|---|---|---|---|---|---|
| 249 nm | 0.62 | 0.77 | 0.95 | 1.50% | 8.7 mW |
| 250 nm | 0.62 | 0.77 | 0.95 | 1.15% | 15.0 mW |
| 262 nm | 0.55 | 0.72 | 0.94 | 1.54% | 10.4 mW |

Table 2 shows the Al compositions, LED external quantum efficiencies (EQEUVs), and UV light outputs of 249-nm, 250-nm, and 262-nm AlGaN layers.

The maximum EQE is 1.50% and the maximum output is 8.7 mW at a wavelength of 249 nm. The maximum EQE is 1.15% and the maximum output is 15.0 mW at a wavelength of 250 nm. The maximum EQE is 1.54% and the maximum output is 10.4 mW at a wavelength of 262 nm. High levels of maximum EQE and output can be obtained as shown in table 2.

Table 1 above shows examples of MOCVD growth conditions used herein for a nucleation layer (3a) (ammonia pulse-flow growth; growth condition: AlN1), a burying layer (3b) (ammonia pulse-flow growth; growth condition: AlN2), and continuous growth layer (3c) (growth condition: AlN3) of an AlN buffer formed by "the ammonia pulsed-supply multistep growth method." Table 1 also shows a barrier layer (growth condition: AlGaN1) and an MQB barrier layer (growth condition: AlGaN2) for the 250-nm AlGaN quantum well LED. AlN buffer growth conditions comprise growth temperatures (1200° C.-1300° C.) higher than temperatures generally used for GaN or AlGaN (1000° C.-1120° C.) in order to improve AlN crystal quality. In addition, the V/III ratio (molar ratio of the supply of group V elements to the supply of group III elements) used herein is lower than that generally used for GaN or AlGaN (2000 or more). Further, general AlGaN growth conditions are used as MQB barrier layer growth conditions. For growth, a horizontal vacuum MOCVD reactor is used under the following conditions, for example: growth temperature: 1120° C.; growth pressure: 76 torr (133.32 Pa=1 torr); TMG supply: 1 sccm; TMA supply: 50 sccm; and NH$_3$ supply: 2000 sccm (1 sccm=1.667×10$^{-5}$ l/s).

The MOCVD system used can be implemented by referring to FIG. 2 and FIGS. 7 to 9 of JP Patent Publication (Kokai) No. 2004-228489 A, for example, which is a patent document by the present inventors, and therefore description of details of the MOCVD system will be omitted herein.

Figure 3:
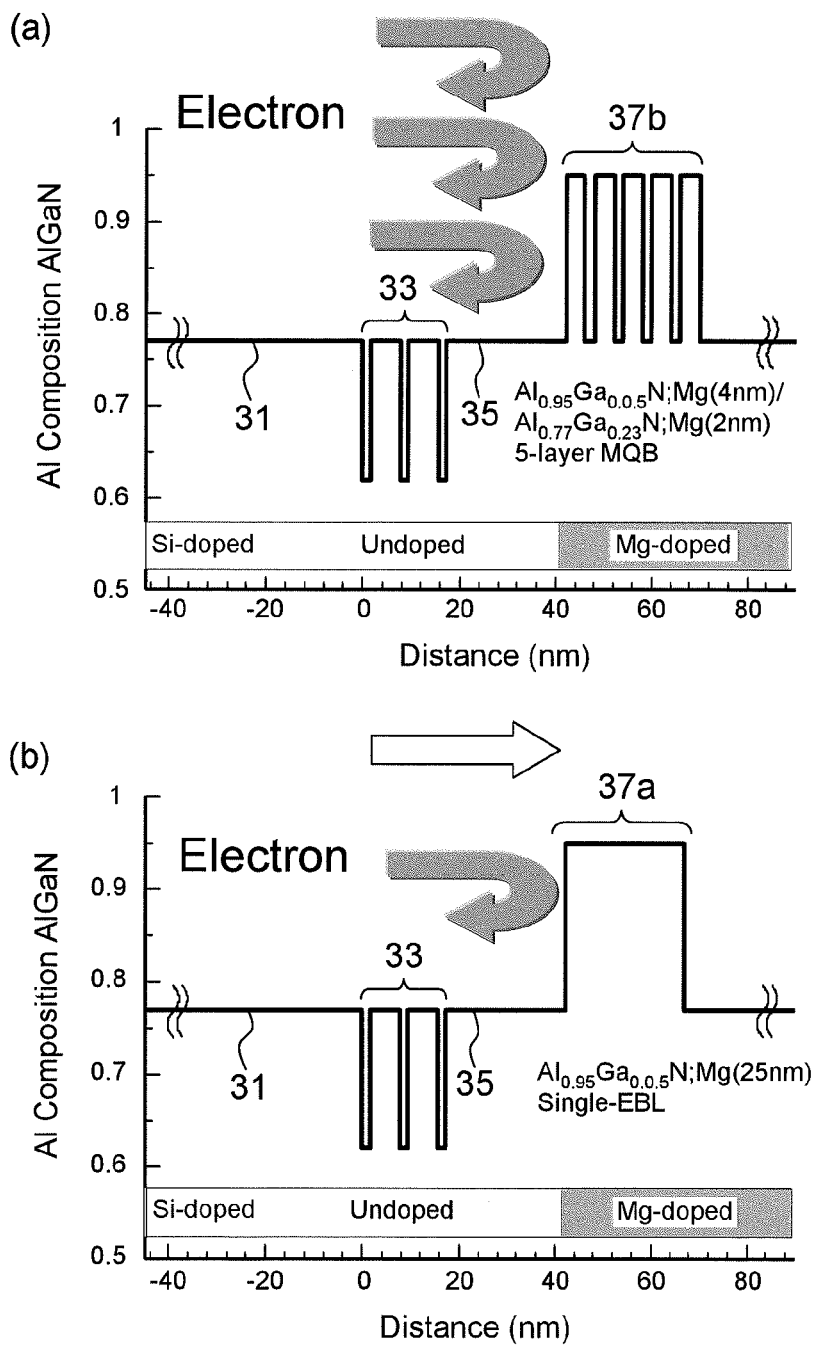
FIG. 3 schematically shows advantages of a multiquantum barrier over a conventional single electron-blocking layer.

FIG. 3 schematically shows advantages of a multiquantum barrier over a conventional single electron-blocking layer. FIG. 3 shows energy band profiles of the Al compositions of 250-nm AlGaN quantum well LEDs, which seem to tend to be substantially identical to energy band profiles of non-polar crystal LEDs in operation. FIG. 3 is therefore useful for explaining general MQB effects. In the case of the energy band profile of a C-plane-grown strongly polar crystal, the slope of the band must be taken into account, as in the case of FIG. 9. Such case is rather difficult to understand. As shown in FIG. 3 (b), an Al$_{0.95}$Ga$_{0.05}$N:Mg (25 nm) single electron barrier can almost completely reflect electrons having energy levels below the barrier height; however, it cannot reflect most electrons having energy levels above the barrier height. Thus, the electron barrier height is limited by the conduction band discontinuity. As shown in FIG. 3 (a), a 5-layer Al$_{0.95}$Ga$_{0.05}$N (4 nm)/Al$_{0.77}$Ga$_{0.23}$N (2 nm) MQB can reflect electrons having energy levels above the barrier height because of quantum-mechanical electron reflection effects.

The electron blocking height of a single barrier (SQB) is limited depending on the materials constituting the SQB, while on the other hand, the height of an MQB can be further increased to a level exceeding the height limited depending on the materials constituting the MQB by making use of quantum-mechanical multi-layer reflection effects. As described below, the effective height can be improved to about 3.5 times at a maximum by optimizing the barrier height and thickness of each layer.

In the previous studies of the present inventors, even when AlN having the highest barrier height or AlGaN with an Al composition of 95% or more was used for an electron-blocking layer, the electron injection efficiencies of AlGaN UV LEDs were as low as 10%-30% (in cases of 240- to 280-nm LEDs). This was a major obstacle to the realization of high-efficiency UV LEDs. In addition, such low electron injection efficiency is derived from the low hole concentration of p-type AlGaN, and thus it has been considered impossible to overcome. By making use of MQBs formed in accordance with design standards suggested based on the present invention, it would become possible to solve such underlying problems. Thus, MQB effects are very important for realization of high-efficiency AlGaN-based UV LEDs.

In addition, electron leakage into the p-side layer is accelerated following elevation in the carrier density in the light-emitting layer region caused by an increase in the injected current density. The injected current density for UV LDs is about 10-100 times that for UV LEDs. Therefore, the electron injection efficiency for UV LDs further declines compared with that for UV LEDs, which results in destruction of UV LDs due to overheating before the current density reaches the oscillation threshold. Even if oscillation can take place, high output cannot be obtained. As described above, MQB has a feature of achieving a high electron blocking height, and thus MQB is highly effective for reflection of electrons having high energy levels generated as a result of an increase in the carrier density. MQB is therefore believed to significantly contribute to UV LD oscillation and high-efficiency UV LD technology. UV LEDs can be operated with reduced droop because high electron injection efficiencies can be achieved at high injection currents. Thus, stable UV LEDs capable of maintaining efficiency without reduction even at high-power output can be provided.

For blue LEDs used for white lamps that have been in progress for commercialization, very high levels of external quantum efficiency (EQE) can be achieved during low current operation; however, EQE declines during high-power operation. Such droop is a serious problem. One possible factor that causes such droop is a decrease in electron injection efficiency due to electron leakage upon high current injection, as in the case of UV LEDs. In order to improve the droop, it is important to introduce an electron-blocking layer with a sufficiently large electron barrier height. One possible solution is to insert an AlGaN electron-blocking layer with a high Al composition (20%-50%). However, in consideration of management of conduction of a low-resistance p-type layer and strains, the use of such an AlGaN electron-blocking layer with a high Al composition for a blue LED rather causes an unfavorable decline in device efficiency. Meanwhile, even if an MQB comprises a barrier layer with an Al composition of as low as 10% or less, an effective electron blocking height several times higher than the barrier layer height can be achieved, making it possible to obtain the maximum effects at a low Al composition. Accordingly, the above droop can be improved while realizing conduction of a low-resistance p-type layer and low strain of each layer. As described above, the use of MQB is very important because it results in the improvement of efficiency upon high current injection, allowing stable high-power operation of blue LEDs. Similarly, MQB effects are believed to be very useful for near-UV or green light-emitting elements. The effects are thus very important to realize high-efficiency nitride light-emitting elements with widely ranging wavelengths of 220-550 nm.

Figure 4:
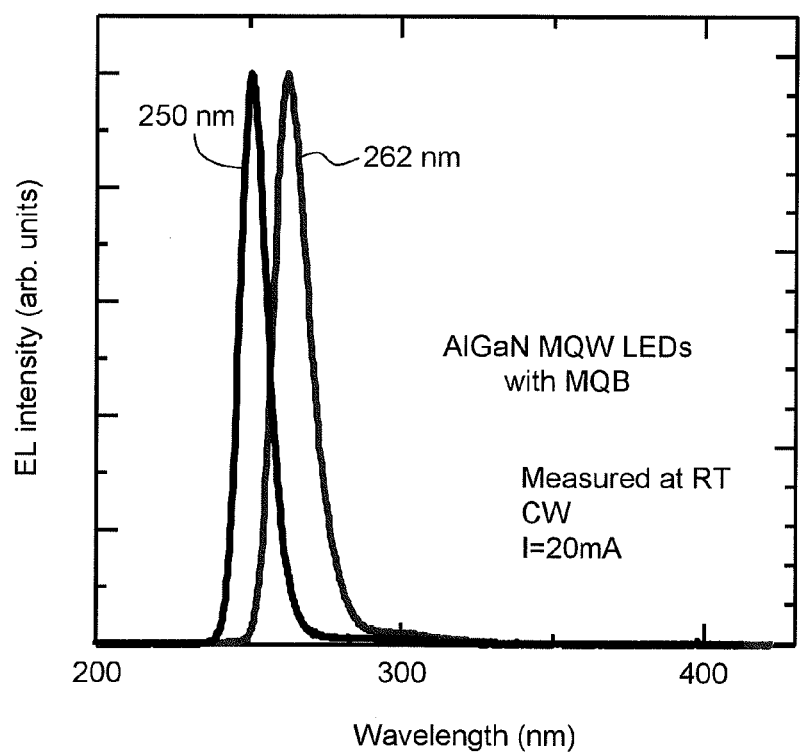
FIG. 4 shows light-emitting characteristics of AlGaN UV LEDs with a multiquantum barrier (wavelength: 250-262 nm) during room temperature operation.

FIG. 4 shows light-emitting characteristics of AlGaN quantum well UV LEDs with a multiquantum barriers (wavelength: 250-262 nm) during room temperature operation. As shown in FIG. 4, clear single peaks are observed at 250 nm and 262 nm, indicating that the intensities of other forms of light emission derived from impurities and the like are as small as about 1/100 those of the peaks. It is understood that deep-UV light-emitting elements in this embodiment have excellent light-emitting element characteristics.

Figure 5:
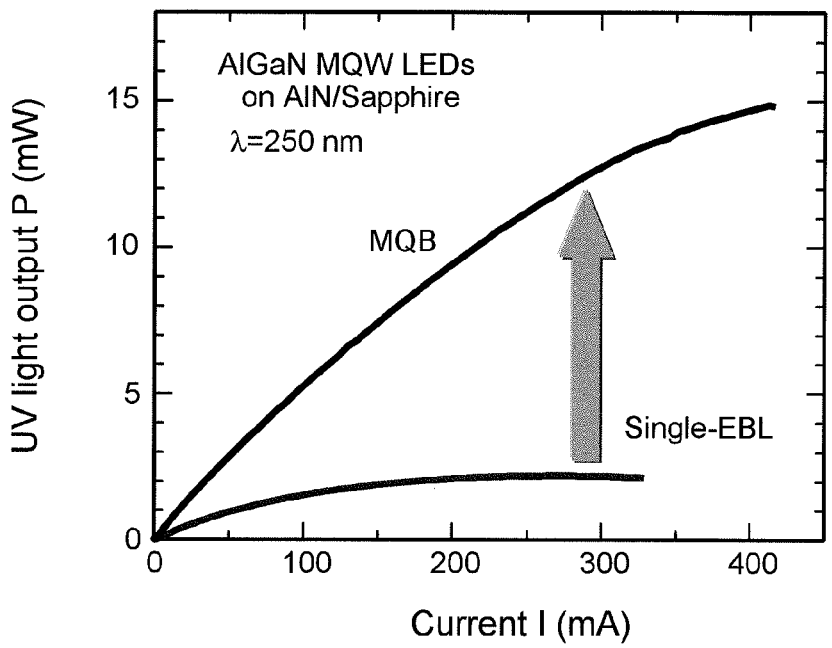
FIG. 5 shows the improvement of efficiency of an AlGaN UV LED with a multiquantum barrier at a wavelength of 250 nm.
Figure 5:
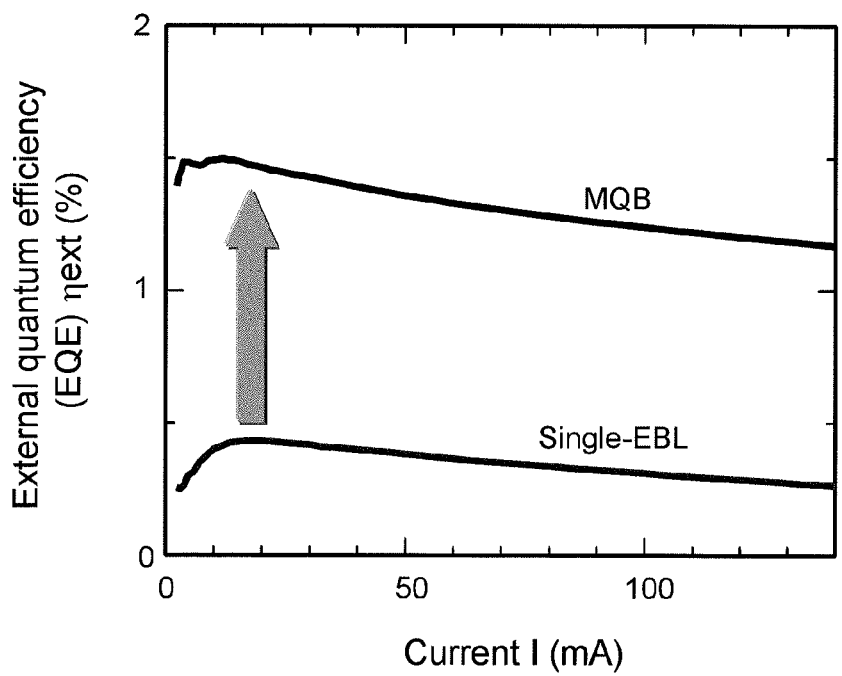

FIG. 5 shows an example of the improvement of efficiency of an AlGaN quantum well UV LED having an electron-blocking layer comprising a multiquantum barrier at a wavelength of 250 nm. FIG. 5 also shows characteristics of an AlGaN quantum well UV LED having a single electron-blocking layer (EBL) for comparison. In FIG. 5 (a), the longitudinal axis represents UV light output. In FIG. 5 (b), it represents EQE (external quantum efficiency). As shown in FIG. 5, the external quantum efficiency can be improved by about 4 times for a 250-nm AlGaN-type LED.

Figure 6:
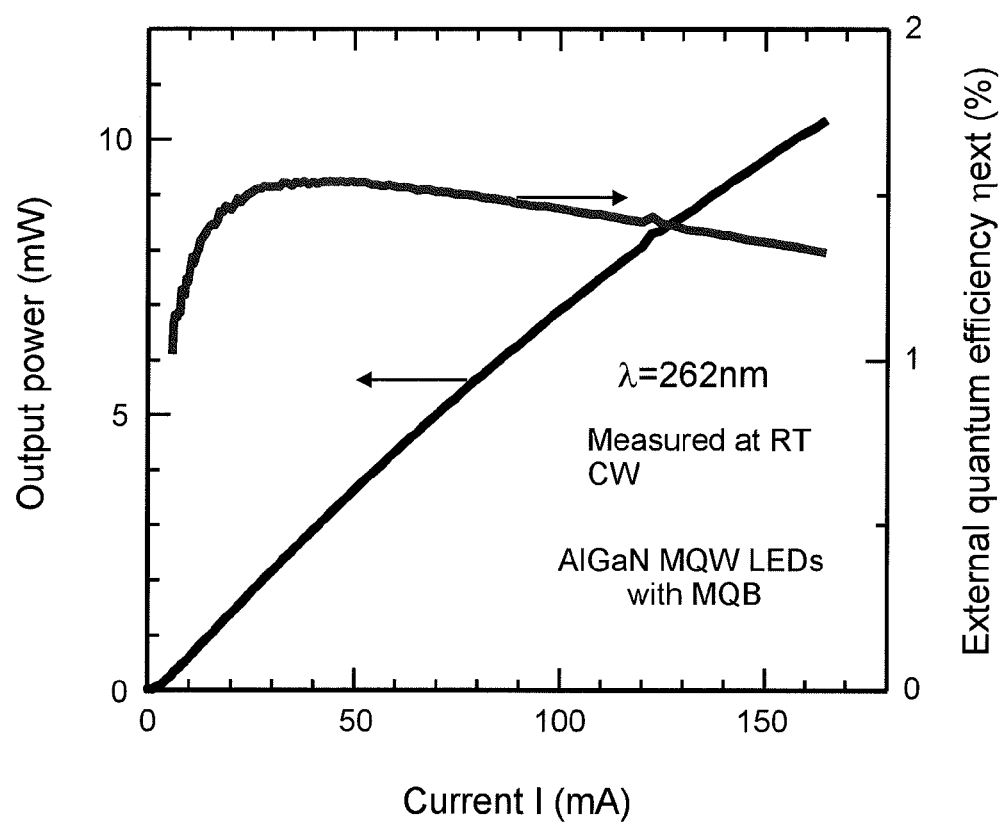
FIG. 6 shows operating characteristics of a 262-nm AlGaN UV LED with a multiquantum barrier.

FIG. 6 shows operation characteristics of a 262-nm AlGaN UV LED with a multiquantum barrier. As shown in FIG. 6, the following favorable characteristics were realized: EQE: 1.54%; and output power: 10.4 mW.

Table 2 summarizes the EQE and output results for currently available AlGaN quantum well UV LEDs with wavelengths of about 250-260 nm with the Al compositions of the respective AlGaN layers.

At a wavelength of 249 nm, the maximum EQE is 1.5% and the maximum output is 8.7 mW. At a wavelength of 262 nm, the maximum EQE is 1.54% and the maximum output is 10.4 mW. At a wavelength of 250 nm, the obtained continuous output is 15.0 mW. These values are the current best data.

When UV LEDs are used for sterilization, a continuous output of 10 mW corresponds to an intensity at which 99% or more of bacteria can be sterilized as a result of irradiation from a 20-cm-distant point for about 1 minute. This output level can be a benchmark for, for example, household use of UV LEDs in practice for sterilization. As described above, the output of an AlGaN-based UV LED with an MQB significantly has exceeded the benchmark, resulting in achievement of the output at practical level.

Figure 7:
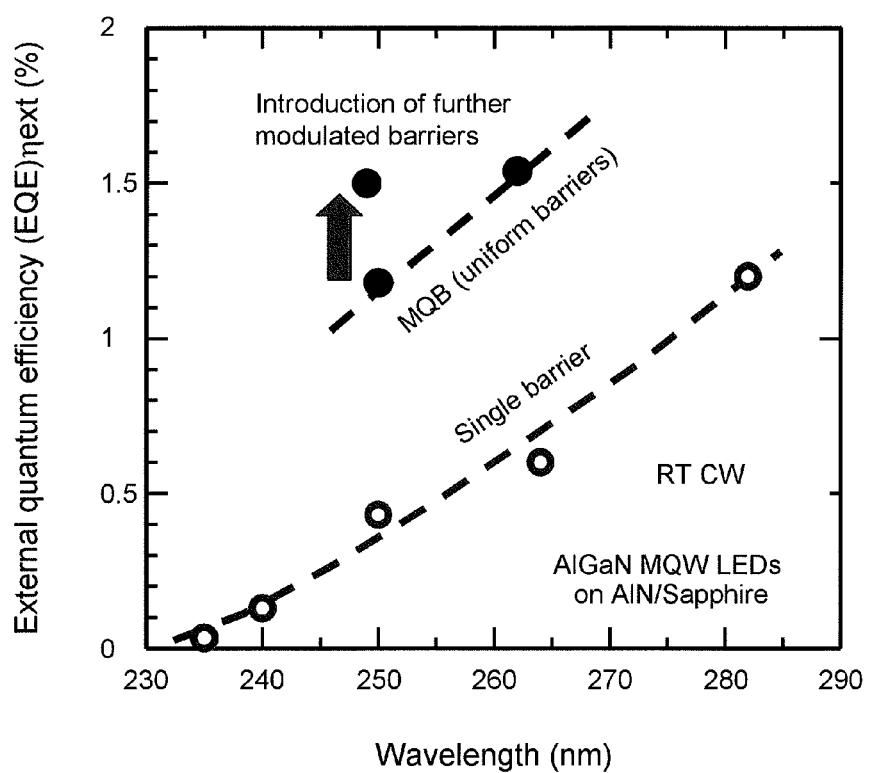
FIG. 7 shows effects of using a multiquantum barrier for improving external quantum efficiency (wavelength dependence).

FIG. 7 shows the effect of using a multiquantum barrier (MQB) electron-blocking layer for improving external quantum efficiency (wavelength dependence). It is understood that higher external quantum efficiency can be obtained using a multiquantum barrier electron-blocking layer than that obtained using a single barrier electron-blocking layer. High levels of external quantum efficiency can be achieved even at room temperature. In the case of FIG. 7, remarkable effects were obtained at a wavelength band of 250-260 nm. The maximum EQE (1.5% at 249 nm) for an AlGaN quantum well LED with an MQB was improved to a level about 4 times greater than 0.4% for that comprising a conventional SQB. In addition, the maximum output (15.0 mW at 250 nm) was about 7 times greater than 2.2 mW for that comprising a conventional SQB at 250 nm. Optimization of the MQB structure allows further improvement of efficiency/output. Similar effects can be obtained within a broad UV region of 220 nm to 390 nm.

Variables for calculation of the obtained external quantum efficiency for a UV AlGaN quantum well LED are discussed below.

Variables for calculation of external quantum efficiency $$\eta_{ext} = \eta_{int} \times \eta_{ext} \times \eta_{inj}$$ Formula 1

Here, $\eta_{ext}$ represents external quantum efficiency (EQE), $\eta_{int}$ represents internal quantum efficiency (IQE), $\eta_{ext}$ represents light extraction efficiency (LEE), and $\eta_{inj}$ represents electron injection efficiency (EIE).

The values of the variables for calculation of the external quantum efficiency of a 250-nm AlGaN quantum well LED with an MQB (maximum EQE: 1.5%) are estimated below. IQE is estimated to be about 30% based on temperature dependence of photoluminescence (PL) from a sample LED having a similar structure. LEE can be calculated using the element structure, and it is estimated to be about 6%. Electron injection efficiency (EIE) is estimated to be 83% by dividing external quantum efficiency by IQE and LEE. Meanwhile, in the case of a similar LED having a single electron-blocking layer, EQE is 0.4%. IQE and LEE are substantially equivalent to the above levels. Thus, EIE can be estimated to be 22%. Consequently, introduction of an MQB causes an increase in electron injection efficiency from 22% to about 83%. The obtained effects are immeasurable. The above results indicate that the problem of decline in electron injection efficiency derived from low-hole concentration of p-type AlGaN can be solved by introducing an MQB into an LED.

Embodiments

MQB-structure dependent electron reflectance (1-electron transmission coefficient) corresponding to MQB structure dependence of electron blocking effects of an electron-blocking layer is described below.

Figure 8:
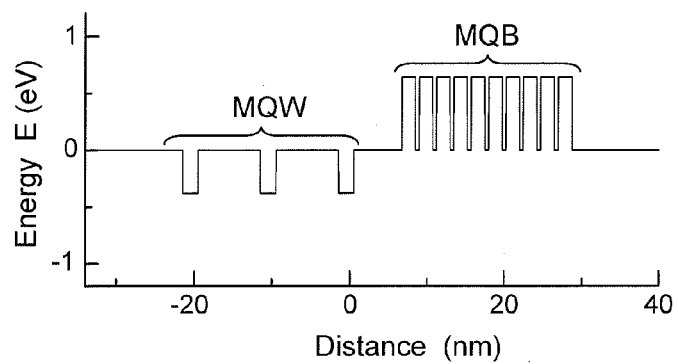
FIG. 8 shows energy band structures of configuration examples of MQW LEDs with an MQB described in the Embodiments of the present invention. Conduction band edges of A-plane-grown non-polar LEDs are shown in the figure.
Figure 8:
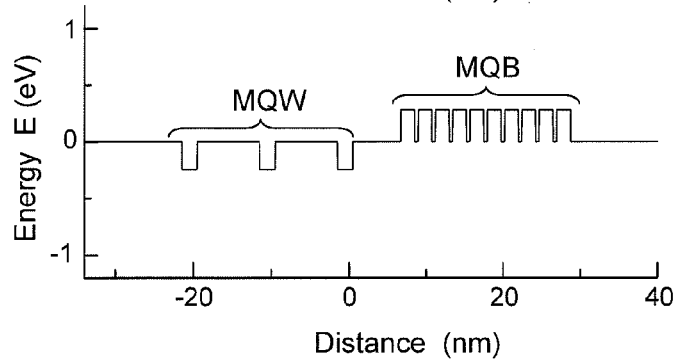
Figure 9:
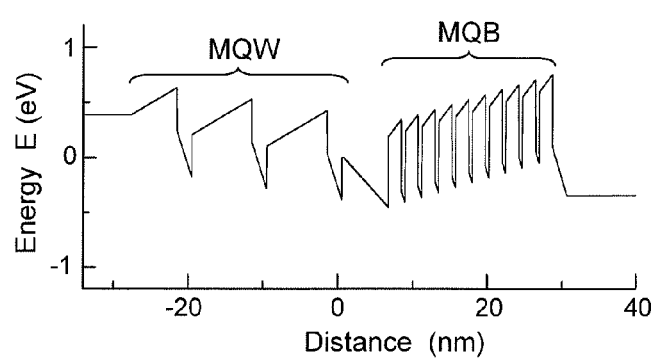
FIG. 9 shows examples of conduction band edges of C-plane-grown (polar) LEDs.
Figure 9:
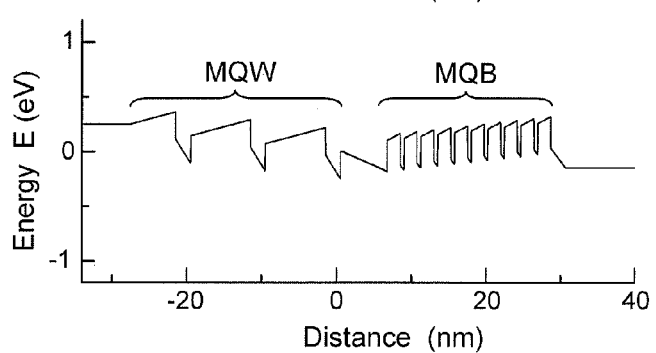

FIG. 8 shows energy band structures of configuration examples of MQW LEDs with a MQB described in the Embodiments of the present invention. Conduction band edges of A-plane-grown non-polar LEDs are shown in the figure. In the case of the structure shown in (a), the Al composition of well/barrier/MQB is 50%/70%/95% (for a large barrier height). In the case of the structure shown in (b), the Al composition of well/barrier/MQB is 75%/85%/95% (for a small barrier height). Both FIGS. 8 and 9 show energy bands of LEDs in operation during which voltage is applied between electrodes. Electrons reflected by an MQB fall into an MQW, resulting in the improvement of light-emitting efficiency.

The band profile of a non-polar LED in operation is obtained as a slightly gradated profile due to electron/hole transport; however, it may be replaced by, for example, a substantially flat band profile as shown in FIG. 8 (a) for general explanation of MQB effects. The structure of FIG. 8 (a) is based on the assumption that the MQB barrier height is at a high level of about 0.6 eV for a 270-nm AlGaN quantum well LED. The structure of FIG. 8 (b) is based on an assumption that the MQB barrier height is at a relatively low level of about 0.3 eV for a 230-nm AlGaN quantum well LED.

LED layer structures of FIGS. 9 (c) and (d) are similar to those of FIGS. 8 (a) and (b); however, FIG. 9 shows examples of C-plane-grown strongly polar crystals. In general, nitride semiconductor crystal structures are wurtzite crystal (hexagonal crystal) structures. In most cases, the type of crystal growth is C-plane growth, which facilitates high-quality crystal formation. In particular, since it is very difficult to achieve flatness for AlGaN crystal growth on a non-polar plane (A-plane or M-plane), formation of a high-quality AlGaN quantum well on a non-polar plane has not been achieved, preventing high-efficiency UV light emission. Therefore, it is important to explore C-plane crystal growth. An A-plane and an M-plane are well-known polar planes for nitride semiconductors.

As shown in FIGS. 9 (c) and (d), very large spontaneous or piezoelectric polarization is automatically applied for AlGaN-based hetero structures, making analysis of band structures very complex. In the cases of FIGS. 9 (c) and (d), given that the crystal of each layer is lattice-matched to the n-type AlGaN buffer layer, the degrees of spontaneous polarization and piezoelectric polarization for the Al composition of each layer are obtained based on the reported values thereof, and the gradient of each layer is drawn in consideration of the gradient of the quasi-Fermi level for electrons and that for holes during LED operation.

As shown in FIG. 9, it is understood that the larger the difference between the Al composition of the AlGaN barrier and that of the AlGaN well, the greater the degree of piezoelectric polarization and the larger the band gradient of each layer. In the case of a 270-nm AlGaN quantum well LED, large piezoelectric polarization is generated in barrier and valley regions of the MQB electron-blocking layer, which causes dislocation of the energy level of each barrier upon arrangement. This makes it difficult to predict electron reflection effects of MQB. Further, the band gradient of the quantum well band is especially large. Therefore, electron leakage due to weakened electron confinement, decreased light-emitting efficiency due to reduction of the squared overlap integral of the electron-hole wave function at the luminescent level, and the like can be predicted. As described above, it is understood that polarity significantly influences the energy band structure. FIG. 9 (d) shows a band profile of a 230-nm LED, for which the Al composition difference between the AlGaN barriers and the AlGaN valleys that form an MQB is as small as 10%. The band gradient derived from polarization shown in FIG. 9 (d) is about half that shown in FIG. 9 (c); however, it can still largely influence MQB effects and quantum well confinement.

Figure 10A:
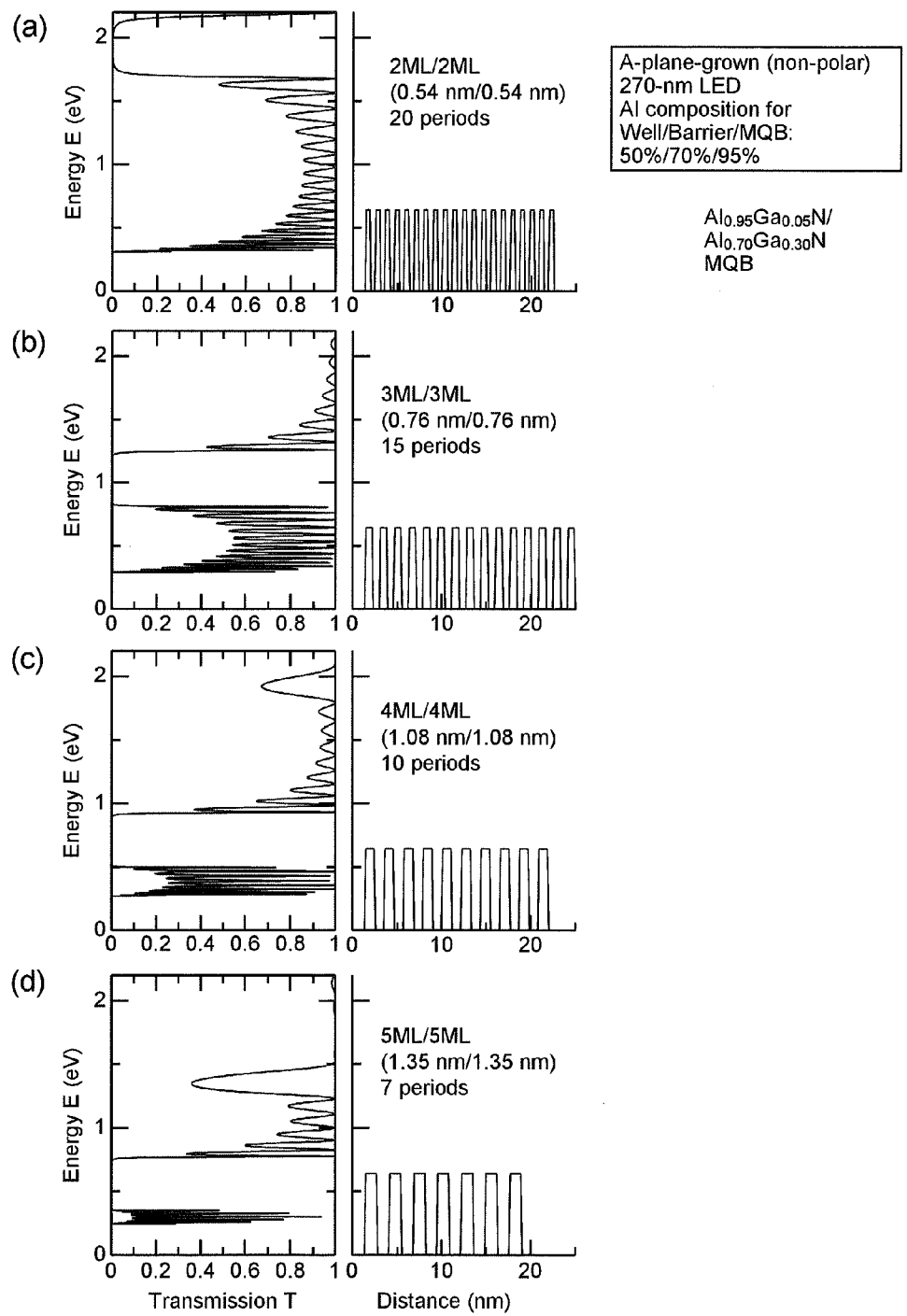
FIGS. 10A and 10B show energy dependences of electron transmission coefficients for A-plane-grown non-polar LEDs with a relatively high barrier corresponding to FIG. 8 (a) (well thickness/barrier thickness: 2 ML/2 ML to 15 ML/15 ML; single barrier: 20 nm).

FIGS. 10A (a) to (d) and 10B (e) to (h) show energy dependences of electron transmission coefficients for A-plane-grown non-polar LEDs with a relatively high barrier corresponding to FIG. 8 (a) (well/barrier thickness: 2 ML/2 ML (monolayer) to 15 ML/15 ML; single barrier: 20 nm).

Figure 10B:
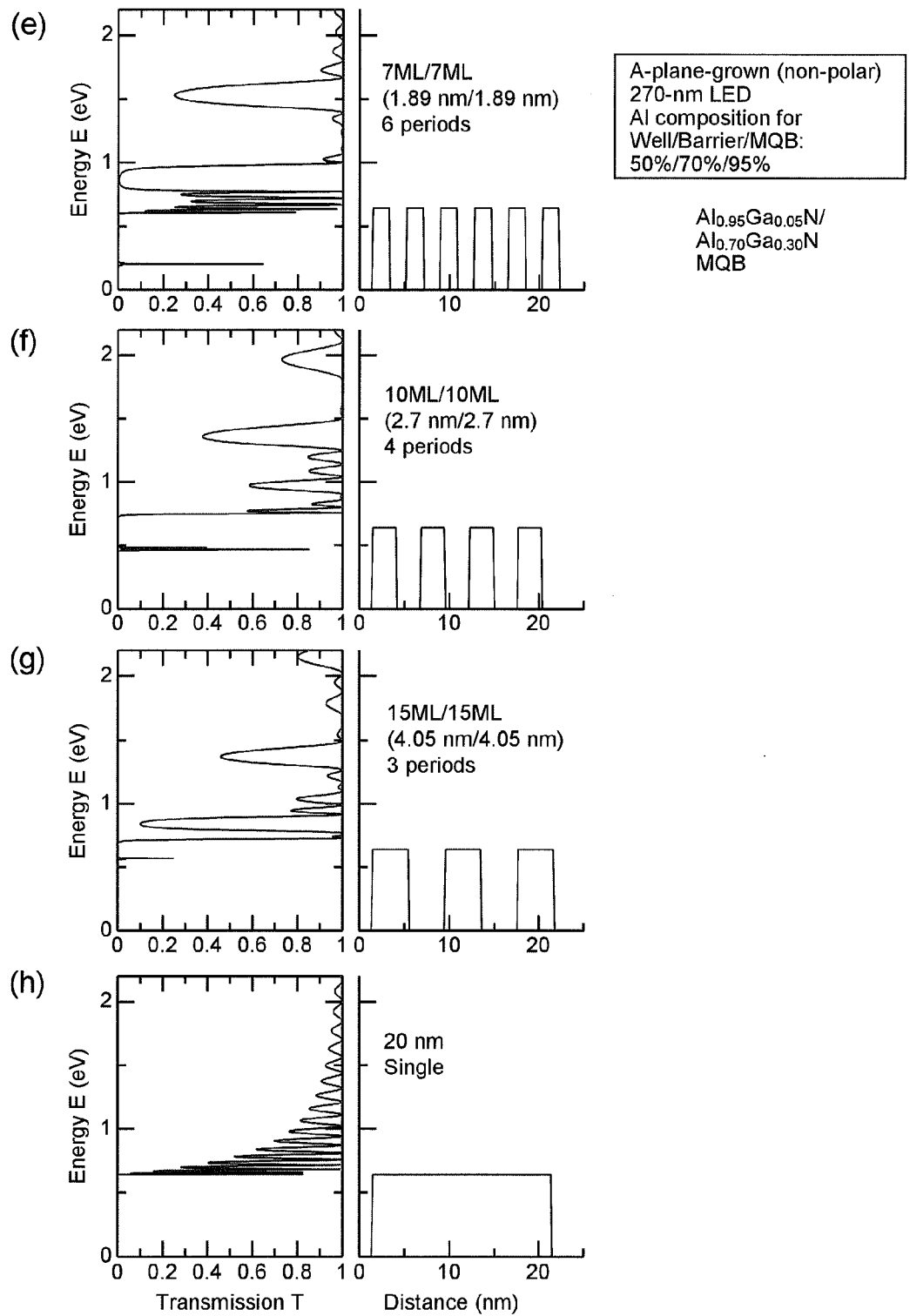

As is apparent from FIG. 10B (h) showing the results for a single barrier, substantially no reflection energy band is formed in a region above the band edge in the case of a single barrier. Even when the single barrier thickness is increased (e.g., 50 nm), such characteristics remain unchanged, and thus quantum-mechanical reflectance is not improved at an energy level above the band edge. In a case of introduction of a currently available single electron-blocking layer, if the thickness is increased, electron blocking effects are intensified. This phenomenon indicates that the electron diffusion and drift are reduced in a thick electron-blocking layer, which is effective for reducing leakage to a p-side layer. However, such effects are not quantum-mechanical effects. MQBs are characterized by quantum-mechanical multiple electron reflection effects.

As is apparent from FIGS. 10A and 10B, as the barrier-well period decreases, an electron reflection region is formed at a higher energy band due to quantum-mechanical effects. In addition, when a thicker barrier (e.g., 7 ML or more) is used, a plurality of reflection bands are obtained. As a result, for example, the reflection energy bands for 2 ML/2 ML, 3 ML/3 ML, 4 ML/4 ML, 5 ML/5 ML, 7 ML/7 ML, 10 ML/10 ML, and 15 ML/15 ML barrier/valley MQBs become 1.7-2.2 eV, 0.8-1.2 eV, 0.55-0.9 eV, 0.35-0.75 eV, 0.65 eV or less and 0.8-1.0 eV, 0.75 eV or less, and 0.7 eV or less, respectively. When the barrier-well period is short, a transmission band with a high transmission coefficient is formed at an energy band below a reflection band. For example, transmission bands of 3 ML/3 ML, 4 ML/4 ML, 5 ML/5 ML, and 7 ML/7 ML barrier/valley MQBs are formed at 0.3-1.7 eV, 0.3-0.85 eV, 0.25-0.55 eV, 0.25-0.35 eV, and 0.65-0.8 eV, respectively. It is understood that such MQB is not convenient in practice. It is important to prevent generation of electron transmission bands in an MQB structure used in practice, and thus it is necessary to configure such structure using a combination of a plurality of barrier/well periods.

A major feature of an MQB used for a nitride semiconductor is that the barrier thickness expected to have desired effects is very low (e.g., 2 ML to 10 ML). In this regard, nitride semiconductors with an MQB significantly differ from conventional InP-based or GaAs-based semiconductors. The nitride semiconductor film thickness is 5 times less than that for the conventional semiconductors. This is because the effective electron mass is as low as about ⅕ that for InP-based semiconductors and the like (effective electron mass: 0.04 (InP) and 0.2 (GaN)).

Since high reflection effects can be obtained with thin-barrier periods, sufficient MQB effects can be obtained in a region within the coherence length of electrons in a medium. This is a great advantage of the use of AlN—GaN-based materials. It is an important point because quantum-mechanical electron reflection effects are reduced by half in a region in which no coherence can be obtained.

Meanwhile, it is necessary to construct a structure with several monolayer periods for an MQB used for a nitride semiconductor, which requires an extremely precise crystal growth method implemented with single atomic layer precision. The present inventors have already used a 5 ML (film thickness: 1.3 nm) multiquantum well for AlGaN growth by MOCVD and have confirmed by TEM (transmission electron microscopy) evaluation that the heterointerface composition can be changed with single atomic layer precision. Light emission from a 3 ML quantum well was also observed. Accordingly, film thickness control of a 2 ML to 10 ML MQB barrier layer can be achieved by currently available technology.

Embodiment 1

Figure 11:
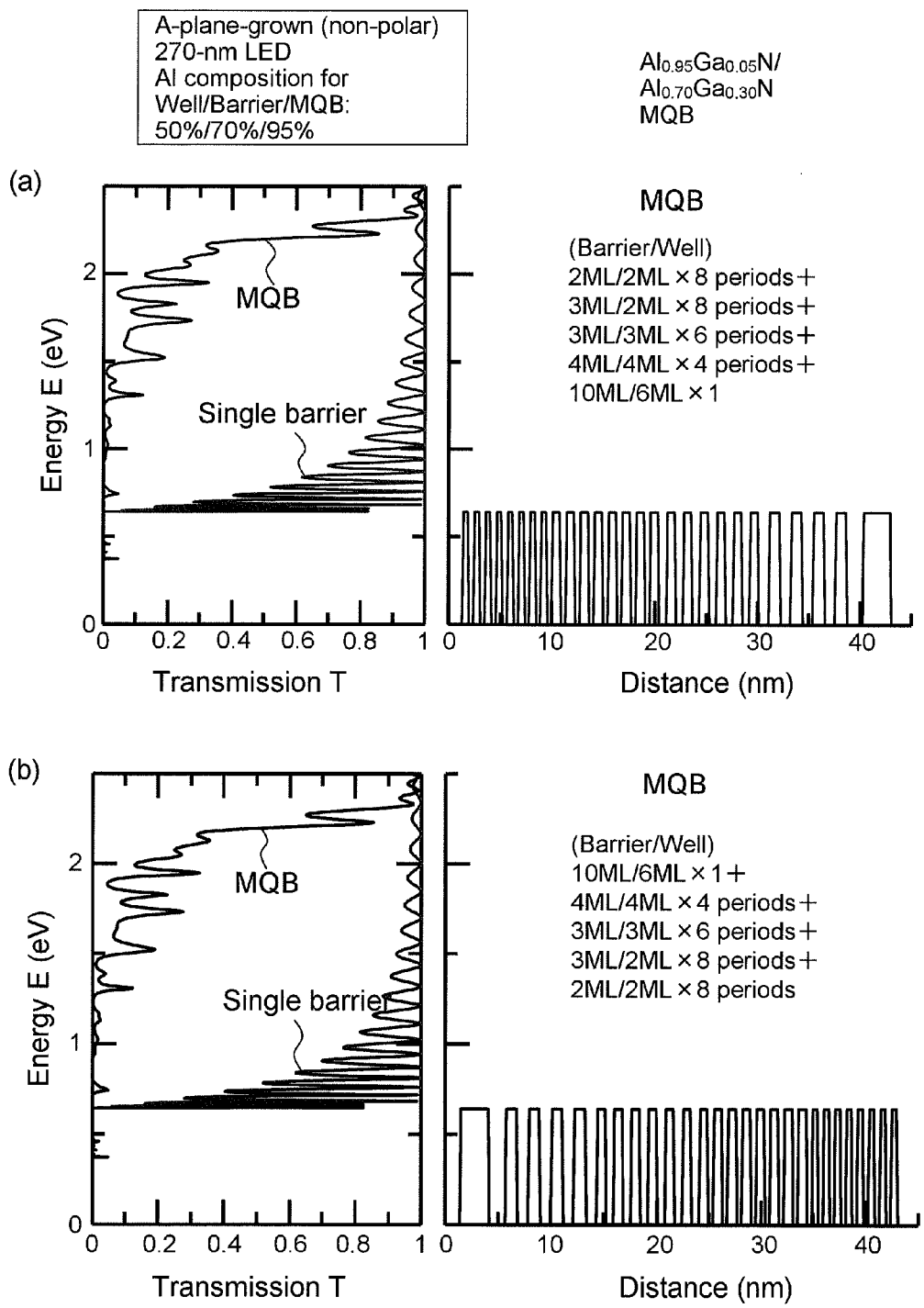
FIG. 11 shows energy dependences of electron transmission coefficients obtained using a single barrier and an MQB based on the results of FIGS. 10A and 10B.

FIGS. 11 ((a) and (b)) shows energy dependences of electron transmission coefficients obtained using a single barrier and an MQB based on the results of FIGS. 10A and 10B. A combination of barrier periods is used so as to achieve high electron reflection at the highest possible energy levels greater than the energy level of the barrier band edge. FIG. 11 shows the following: (a) an example of an MQB structure in which the barrier period increases in order from the MQW side; and (b) an example of an MQB structure in which the barrier period increases in order from the opposite side. Energy dependences of electron transmission coefficients in both cases are lower than those shown in examples of FIGS. 10A and 10B in a wide range. It is understood that electron-blocking layers shown in FIG. 11 are very useful. The effective barrier height is about 3.5 times greater than that for a single barrier.

A comparison of (a) and (b) in FIG. 11 shows that there is no dependence associated with the order of barrier periods in terms of quantum-mechanical analysis. However, electron reflection effects are reduced in a structure with a distance greater than the electron coherence length in actual operation, which will probably result in differences in effects. In view of the coherence length in a semiconductor, it is desirable for the total film thickness (total thickness) to be 40 nm or less in an MQB region. In addition, the electron concentration is higher in a lower energy region, and thus it is reasonable to employ a system for blocking low energy electrons and high energy electrons in that order. As shown in FIG. 11 (b), it is generally considered that electron reflection effects can be easily obtained with an MQB for which the period is changed in descending order from the quantum well side.

Figure 12:
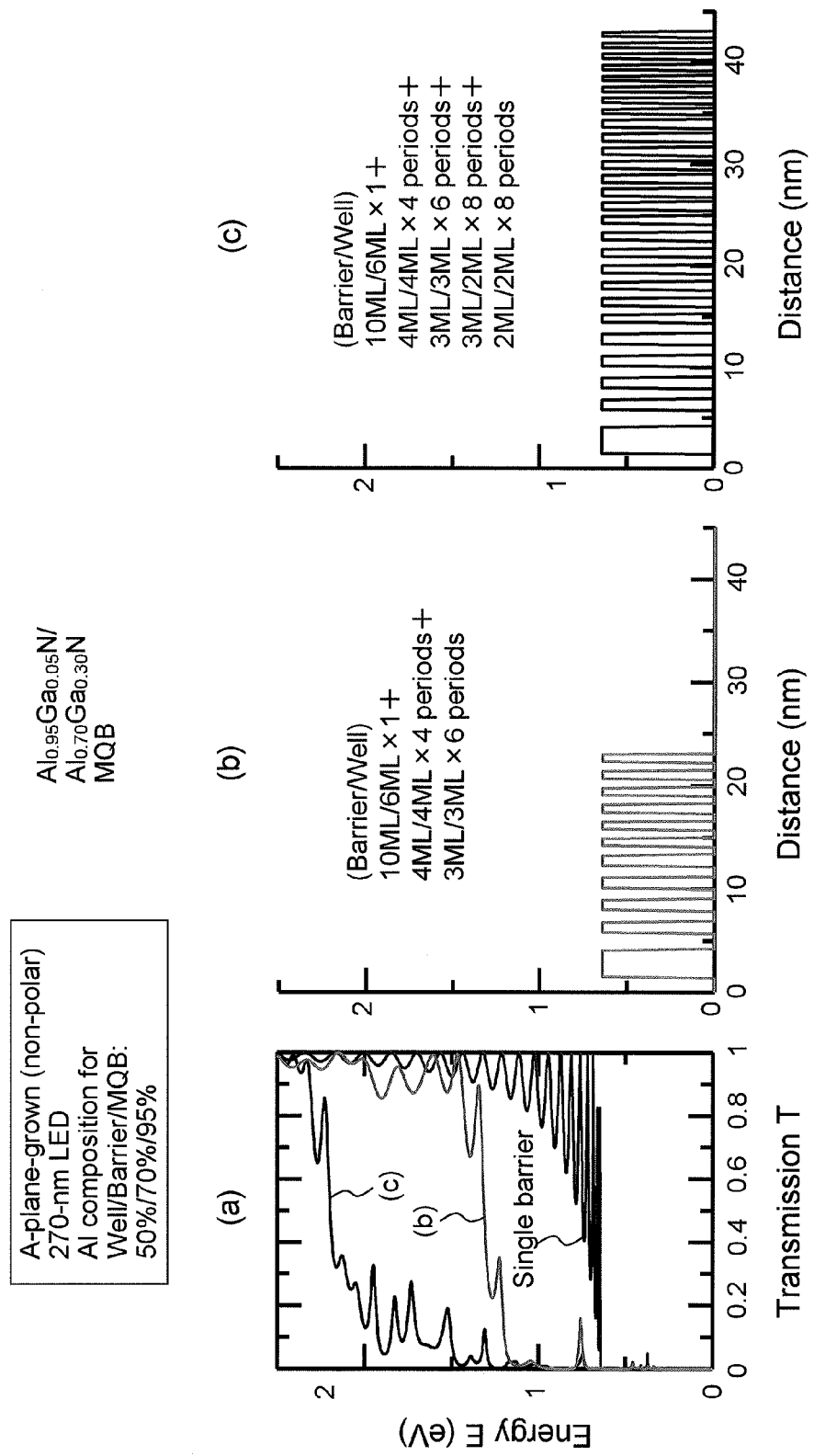
FIG. 12 shows total MQB layer thickness dependences at different periods in relation to energy dependences of electron transmission coefficients for A-plane-grown non-polar MQBs.

FIG. 12 shows total MQB layer thickness dependences at different periods in relation to energy dependences of electron transmission coefficients for A-plane-grown non-polar MQBs. It is understood that as the total thickness increases, electrons can be reflected at increased energy levels. This indicates that the more the quantum barrier type, the wider the range of energy levels for electron reflection, allowing improvement of electron reflection effects. In FIG. 12, even when the total MQB thickness is decreased to a low level of 20 nm, the effective MQB barrier height is about twice that of a single barrier. This teaches that great reflection effects can be obtained even at a low total MQB thickness.

Figure 13A:
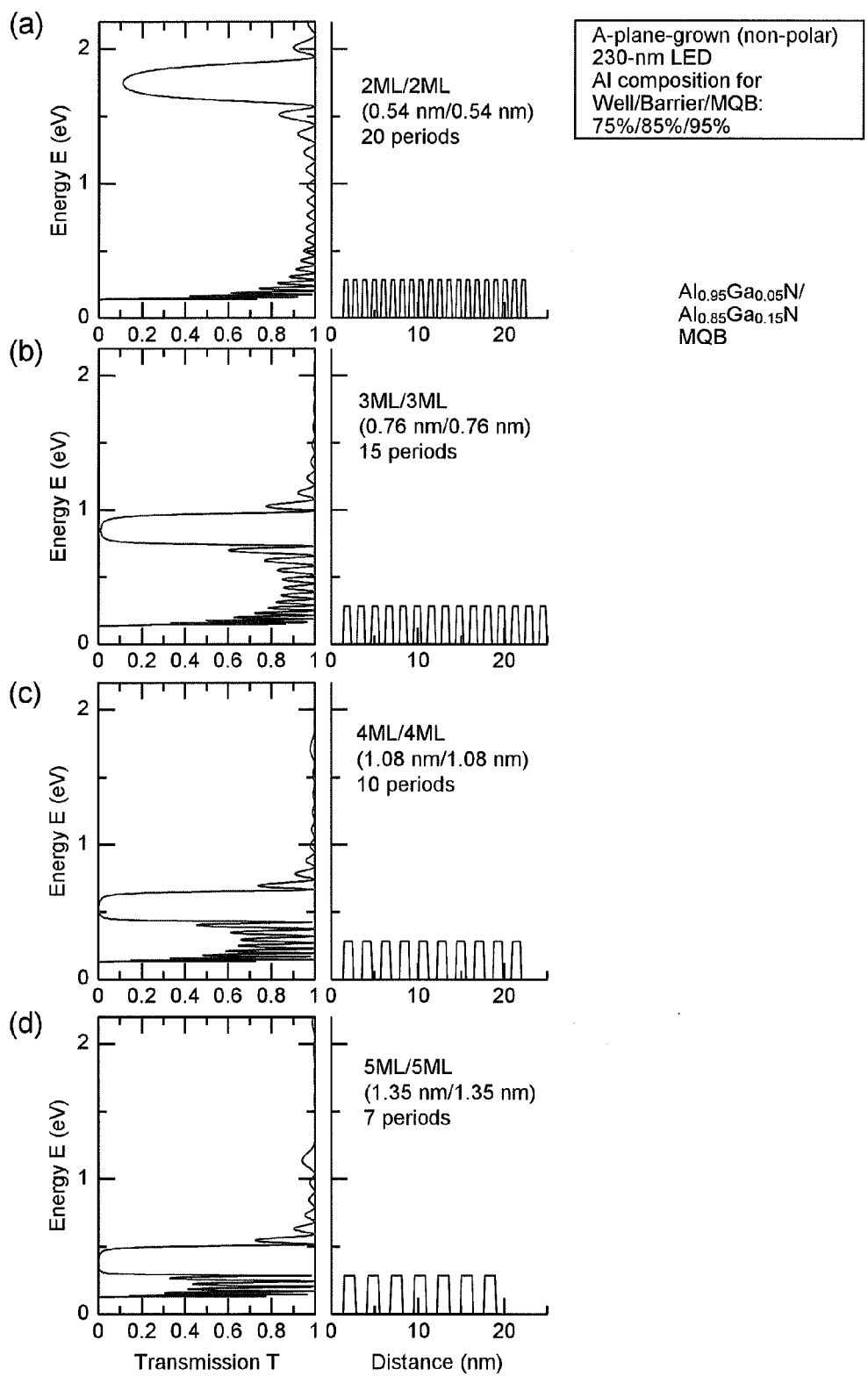
FIG. 13A shows energy dependences of electron transmission coefficients for A-plane-grown non-polar MQBs with relatively low barriers corresponding to FIG. 8 (a).
Figure 13B:
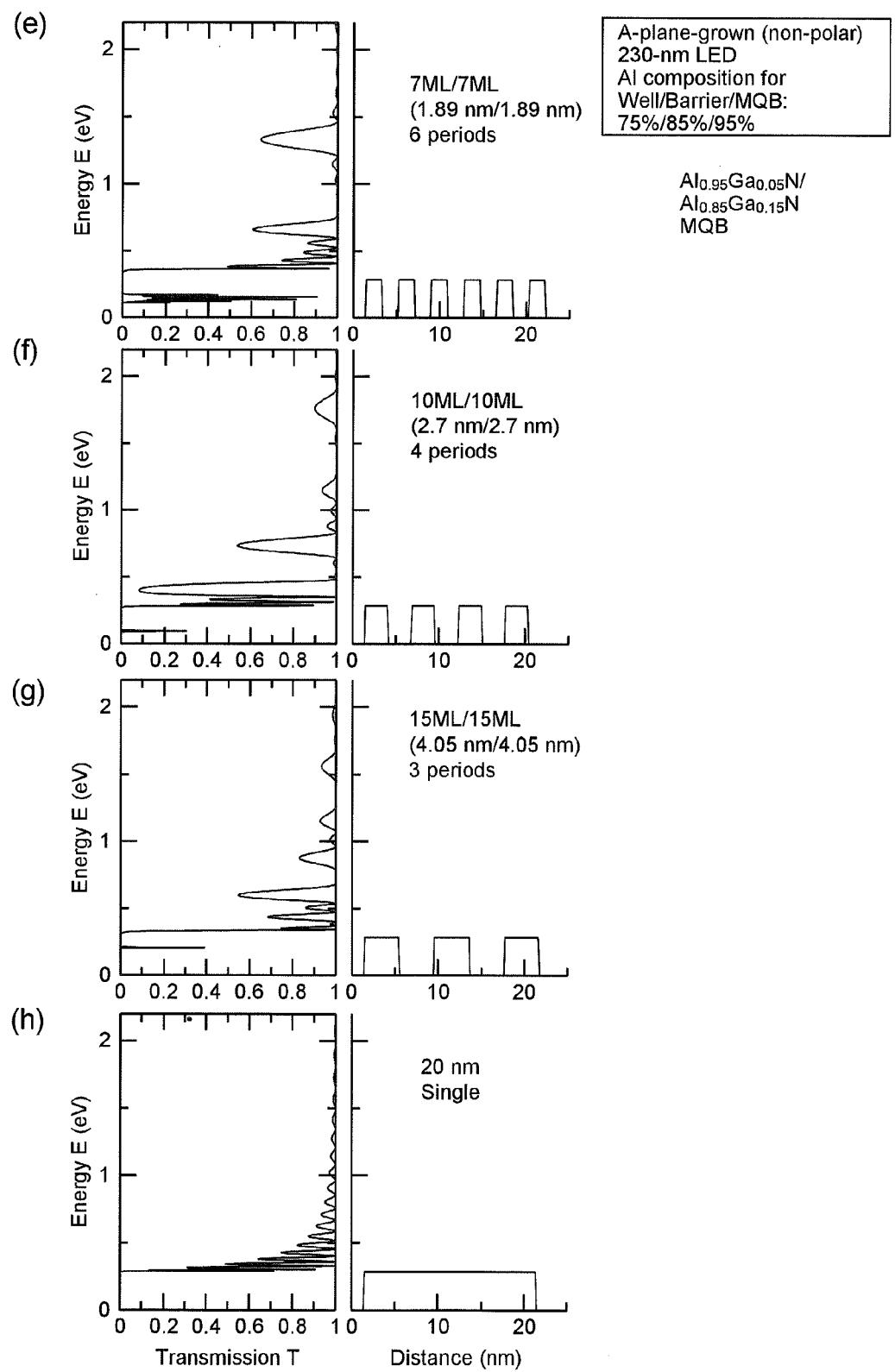
FIG. 13B shows energy dependences of electron transmission coefficients for A-plane-grown non-polar MQBs with relatively low barriers corresponding to FIG. 8 (a).

FIGS. 13A and 13B ((a) to (h)) FIG. 13A show energy dependences of electron transmission coefficients for A-plane-grown non-polar MQBs with relatively low barriers corresponding to FIG. 8 (a). The relationship between the period and the reflection energy band in the cases of FIGS. 13A and 13B is substantially identical to that in the cases in which high barriers are used (FIG. 11); however, the reflection energy band becomes narrowed. In addition, electron reflectance decreases. Accordingly, when a low barrier MQB is used, it is necessary to design an MQB structure with an increase in the number of barrier periods and the like.

Figure 14:
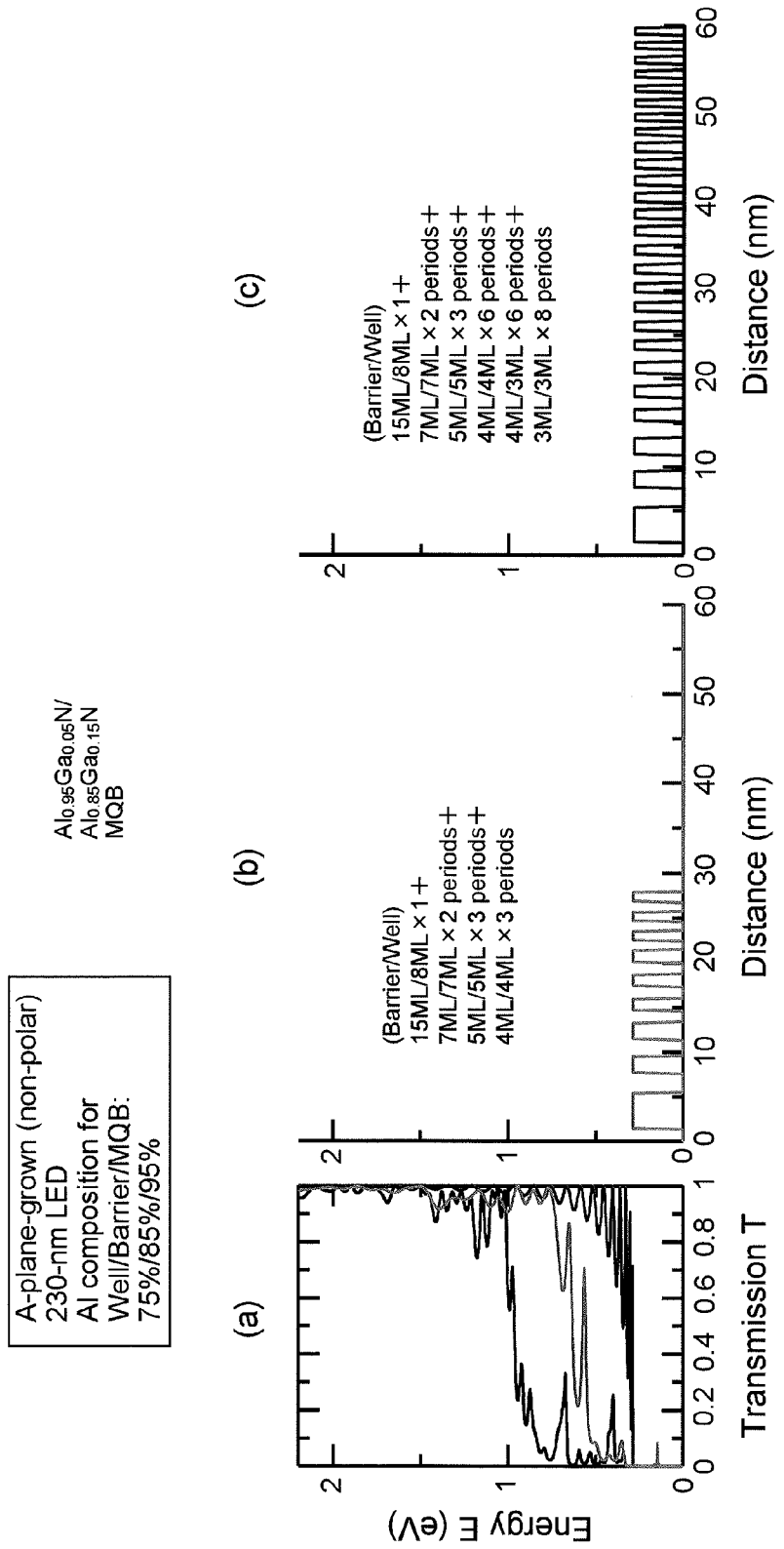
FIG. 14 shows total MQB layer thickness dependences at different periods in relation to energy dependences of electron transmission coefficients for A-plane-grown non-polar MQBs (low barriers.

FIG. 14 shows total MQB layer thickness dependences at different periods in relation to energy dependences of electron transmission coefficients for A-plane-grown non-polar MQBs (low barriers; FIGS. 13A and 13B). It is understood that as the total thickness increases, electrons can be reflected at increased energy levels. Note that a comparison of FIG. 12 and FIG. 14 shows that electrons can be reflected only at low energy levels in FIG. 14. As shown in FIGS. 14 (b) and (c), as the total layer thickness increases, electrons can be reflected at higher energy levels. For example, when the total thickness is about 60 nm, the effective barrier height can be increased to 3 times the actual barrier height, and when the total thickness is about 25 nm, it can be increased to twice the same. Even when the total thickness is 25 nm, a sufficiently effective height can be obtained. This means that significant MQB effects can be obtained even when the barrier height is at a low level corresponding to an Al composition difference of about 10%.

In practice, it is rather complicated to design an MQB structure that allows high reflectance without transmission band generation for a wide variety of energy bands. Thus, it is necessary to provide guidelines to determine a combination of barriers in terms of the barrier period and the number of barrier layers.

Figure 15:
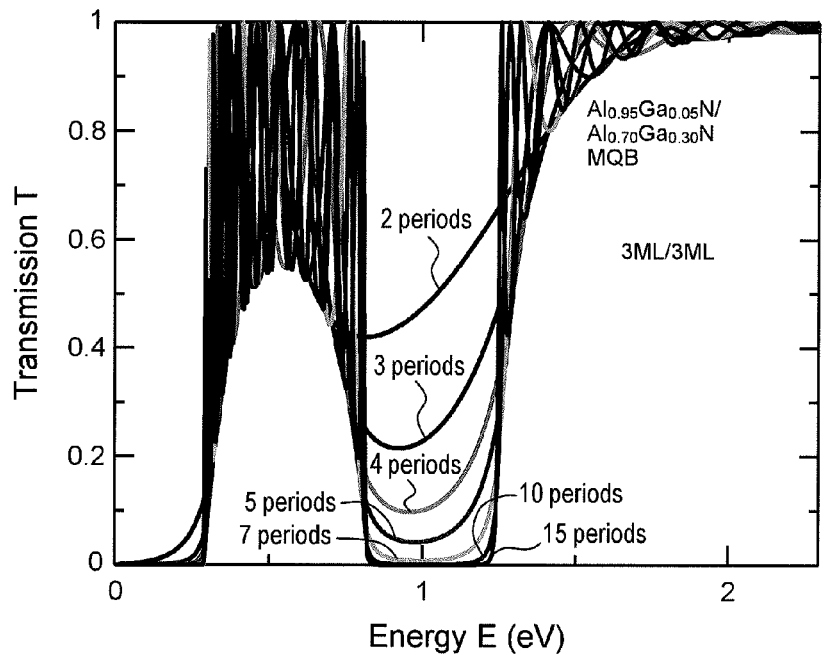
FIG. 15 shows electron transmission coefficient dependences of energy at different periods for A-plane-grown (non-polar) MQBs with high barriers and those with low barriers.
Figure 15:
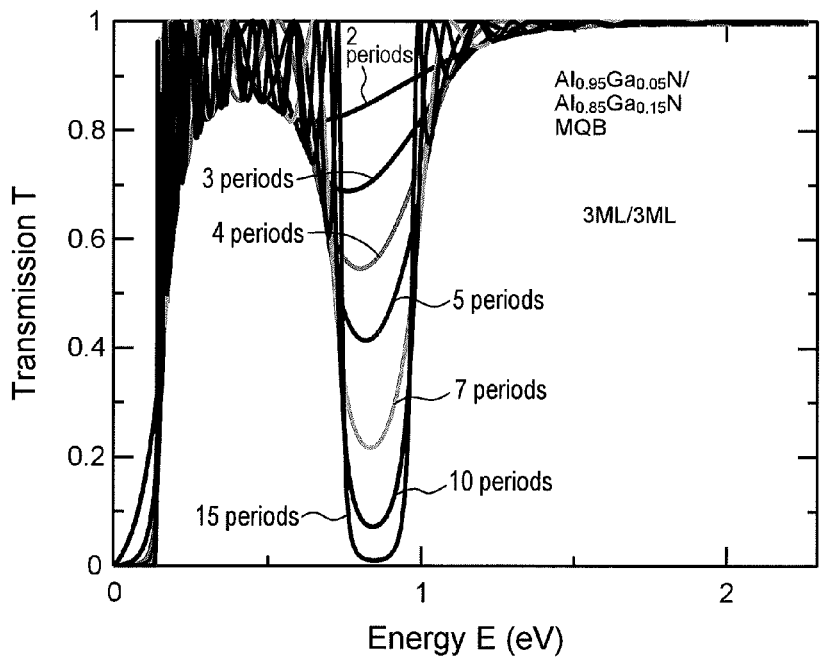

FIGS. 15 ((a) and (b)) shows electron transmission coefficient dependences of energy at different periods for A-plane-grown (non-polar) MQBs with high barriers and those with low barriers. As shown in FIG. 15, it is understood that as the barrier height increases, electrons can be reflected in a wider range of energy levels. It is also understood that the shorter the barrier period, the greater the electron transmission coefficient; that is to say, the longer the period, the easier the electron blocking. Such characteristics can be well understood with reference to color drawings.

Figure 16:
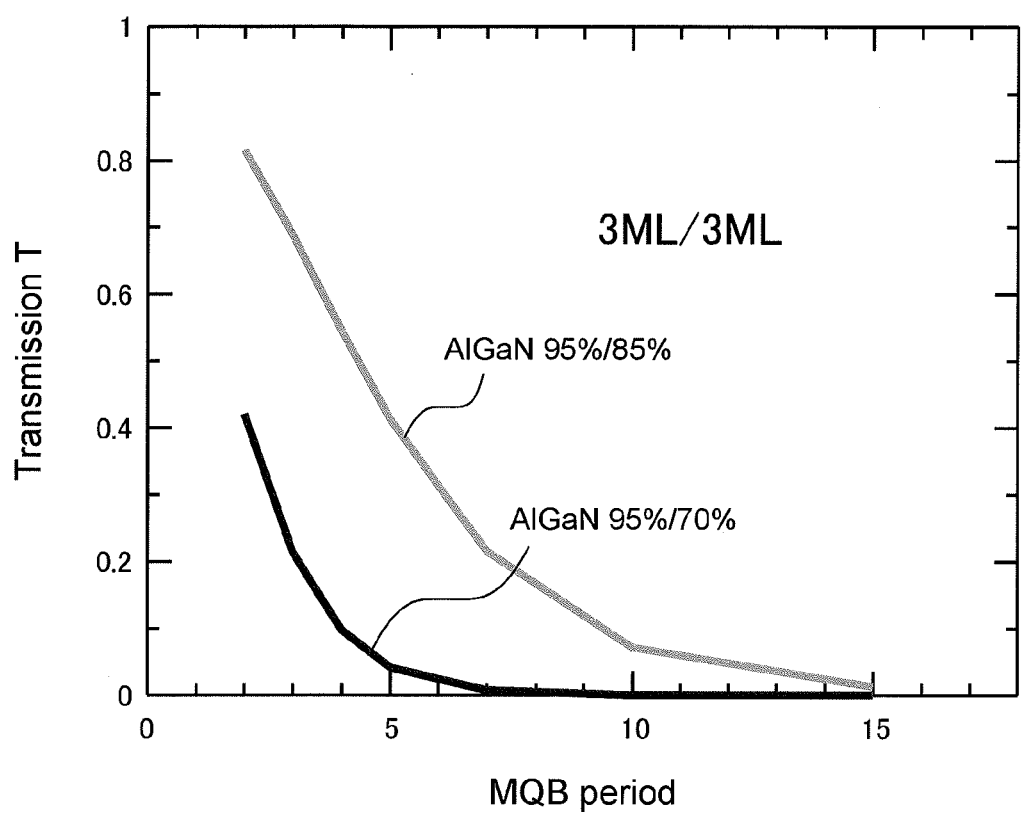
FIG. 16 shows the relationship between MQB periods and electron transmission coefficients based on the barrier heights obtained in the Embodiments as parameters.

FIG. 16 shows the relationship between MQB periods and electron transmission coefficients based on the barrier heights obtained in the Embodiments as parameters. Specifically, FIG. 16 shows MQB period dependence of the transmission coefficient in a case in which an MQB comprising high barriers and low barriers was formed at a 3 ML/3 ML period. As shown in FIG. 16, the greater the number of MQB periods, the lower the electron transmission coefficient. In addition, even at the same number of periods, the greater the barrier height, the lower the electron transmission coefficient.

The above teaches that electron blocking effects can be improved as the barrier height and the MQB period increase.

In practice, an MQB is configured by combining a plurality of barrier layers with different periods. Analysis results show that the total MQB reflectance is almost certainly determined by adding the barrier reflectance of each layer. Thus, an MQB can be easily designed if the reflection energy band that allows high reflection and the number of periods serving as a benchmark are known for barriers with the respective periods. Table 3 summarizes the reflection energy band that allows high reflection and the number of periods serving as a benchmark.

TABLE 3a

MQB reflection energy bands for high barriers (about
0.6 eV) and benchmarks of the number of barrier periods
(Al composition for AlGaN barrier/valley: 95% and 70%)
for obtaining high reflection energy bands

| Barrier/<br>Valley | Reflection<br>band energy | Benchmarks of the number of<br>periods for obtaining high<br>reflection (90%-99%) (A plurality<br>of layers may be laminated at<br>different periods for overlapping<br>reflection band energy levels.) |
|---|---|---|
| 2 ML/2 ML | 1.7-2.2 eV | 6-12 layers |
| 3 ML/3 ML | 0.8-1.2 eV | 5-10 layers |
| 4 ML/4 ML | 0.55-0.9 eV | 3-6 layers |
| 5 ML/5 ML | 0.35-0.75 eV | 3-5 layers |
| 7 ML/7 ML | 0.65 or less,<br>0.8-1 eV | 2-4 layers |
| 10 ML/10 ML | 0.75 eV or less | 2-4 layers |
| 15 ML/15 ML | 0.7 eV | 2-4 layers |

TABLE 3b

MQB reflection energy bands for high barriers (about
0.6 eV) and benchmarks of the number of barrier periods
(Al composition for AlGaN barrier/valley: 95% and 85%)
for obtaining high reflection energy bands

| Barrier/<br>Valley | Reflection<br>band energy | Benchmarks of the number of<br>periods for obtaining high<br>reflection (90%-99%) (A plurality<br>of layers may be laminated at<br>different periods for overlapping<br>reflection band energy levels.) |
|---|---|---|
| 2 ML/2 ML | 1.65-1.9 eV | 15-40 layers |
| 3 ML/3 ML | 0.8-1.0 eV | 7-15 layers |
| 4 ML/4 ML | 0.45-0.65 eV | 5-10 layers |
| 5 ML/5 ML | 0.3-0.5 eV | 4-8 layers |
| 7 ML/7 ML | 0.2-0.4 eVc | 3-6 layers |
| 10 ML/10 ML | 0.3 eV or less | 2-5 layers |
| 15 ML/15 ML | 0.3 eV or less | 2-5 layers |

The number of periods at which a reflectance of 90%-99% can be obtained is shown as a benchmark period that allows high reflection. In addition, table 3a shows values based on an assumption that the barrier height is as great as about 0.6 eV (that is to say, the Al composition of AlGaN barrier/the Al composition of AlGaN valley is 95%/70%), and table 3b shows values based on an assumption that the barrier height is as small as about 0.3 eV (that is to say, the Al composition of AlGaN barrier/the Al composition of AlGaN valley is 95%/85%). In practice, an MQB can be designed in such a manner that a plurality of barriers with the numbers of periods shown in tables 3a and 3b are combined so as not to cause hole formation in the reflection energy band, thereby achieving a total thickness of about 30-50 nm.

Embodiment 2

The characteristics of a C-plane-grown polar crystal are described below. Each of FIGS. 17A to 20 shows characteristics of C-plane-grown (but not A-plane-grown) MQBs substantially similar to those obtained in Embodiment 1. For a polar MQB, MQB effects basically tend to be similar to those for a non-polar MQB. However, the band gradient causes blurred reflectance, making the effects of a polar MQB relatively complicated. The characteristics obtained in the case of a polar MQB are described in detail below.

For a polar MQB, even the barrier energy of a single barrier shows a cutting blade form, and thus the electron barrier is originally higher than that for a non-polar MQB. Accordingly, an increase in the effective barrier height derived from such MQB becomes smaller than that for a non-polar MQB.

In order to form sharp cutting blade shapes of MQB barriers and increase the barrier heights to the maximum possible levels, it is desirable to increase the barrier/valley film thickness ratio. Specifically, the barrier thickness/valley thickness ratio is determined to be, for example, 3 ML/2 ML, 5 ML/2 ML, 10 ML/2 ML, or 15 ML/2 ML so that the barrier thickness and the valley thickness are not adjusted at the same level, thereby allowing formation of high barrier apexes. Similarly, in order to form sharp cutting blade shapes of MQB barriers, it is important to arrange barriers in a descending order of thickness.

Figure 17A:
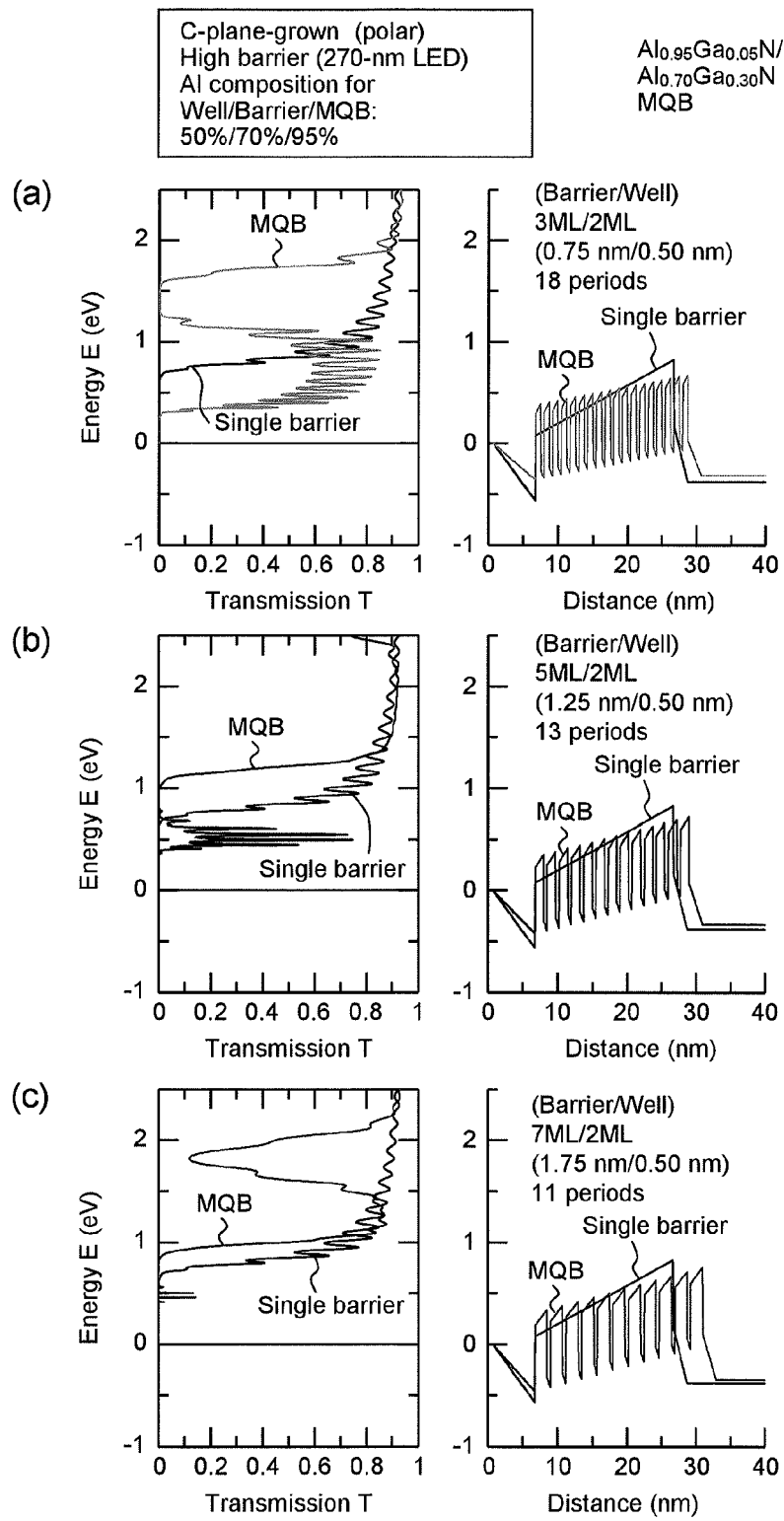
FIG. 17A shows characteristics of C-plane-grown (but not A-plane-grown) MQBs substantially similar to those obtained in Embodiment 1.
Figure 17B:
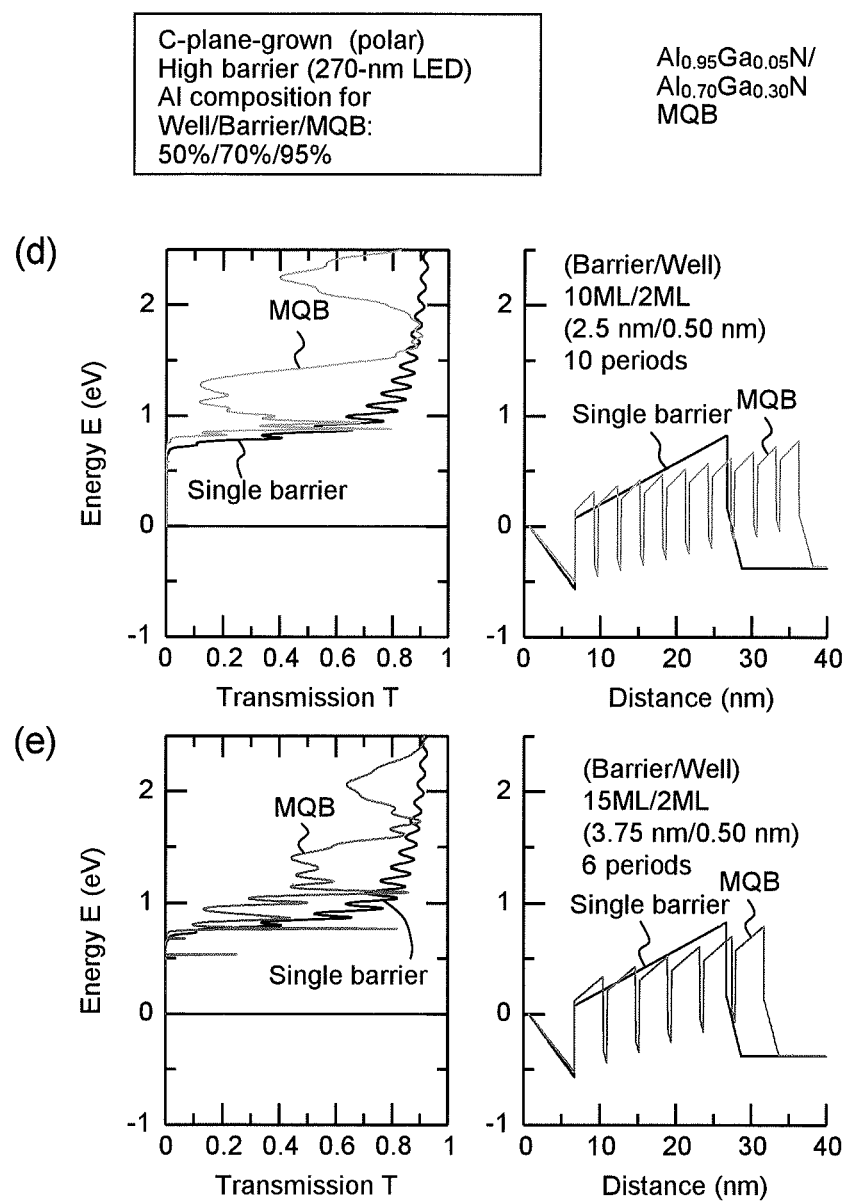
FIG. 17B shows characteristics of C-plane-grown (but not A-plane-grown) MQBs substantially similar to those obtained in Embodiment 1.

As shown in FIG. 17, when an MQB is used, electron blocking effects become greater than those obtained when a single barrier is used, even if the single barrier is comparable to the MQB in terms of height and thickness. A polar MQB has barrier layers with different energy heights, and therefore it has a broader energy distribution in a reflection band and relatively lower reflectance than those for a non-polar MQB.

Figure 18:
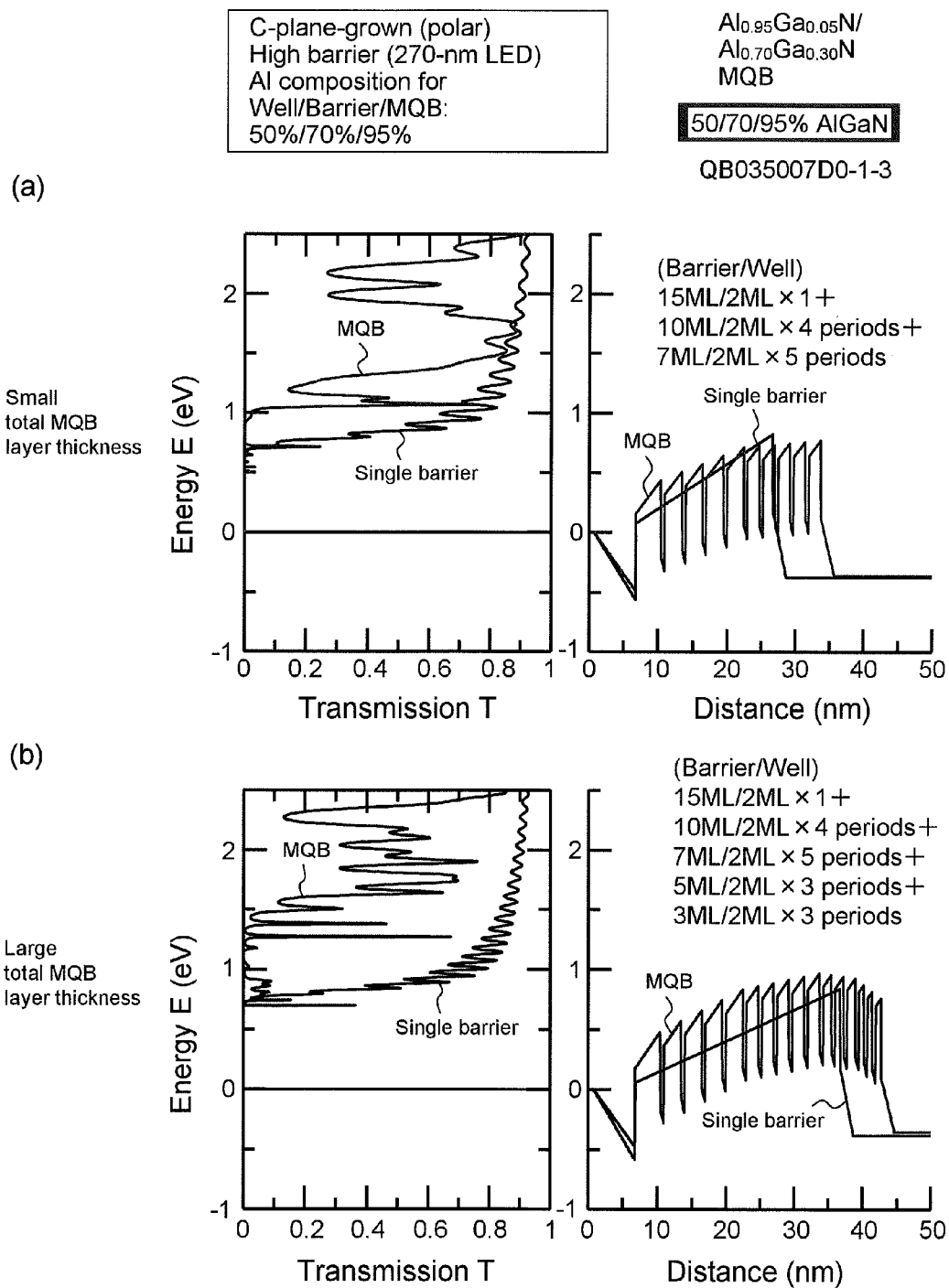
FIG. 18 shows characteristics of C-plane-grown (but not A-plane-grown) MQBs substantially similar to those obtained in Embodiment 1.

FIG. 18 shows total MQB layer thickness dependences of MQB effects for high barriers. When the total MQB thickness is 45 nm, the effective barrier height is about twice that of a single barrier. When the total MQB thickness is 30 nm, it is about 1.5 times the same. The results indicate that high levels of effective barrier heights can be ensured also for general C-plane-grown polar MQBs.

Figure 19A:
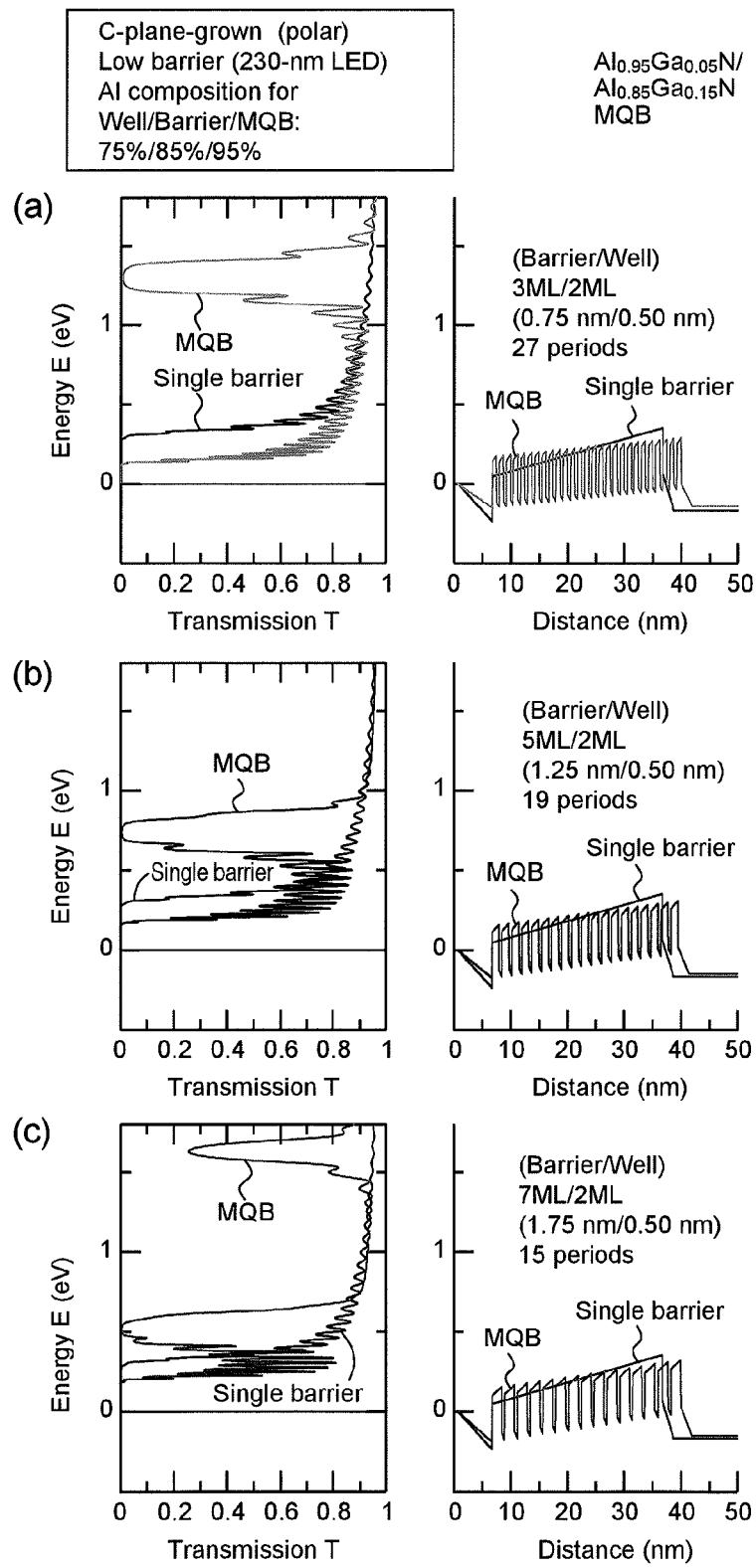
FIG. 19A shows characteristics of C-plane-grown (but not A-plane-grown) MQBs substantially similar to those obtained in Embodiment 1.
Figure 19B:
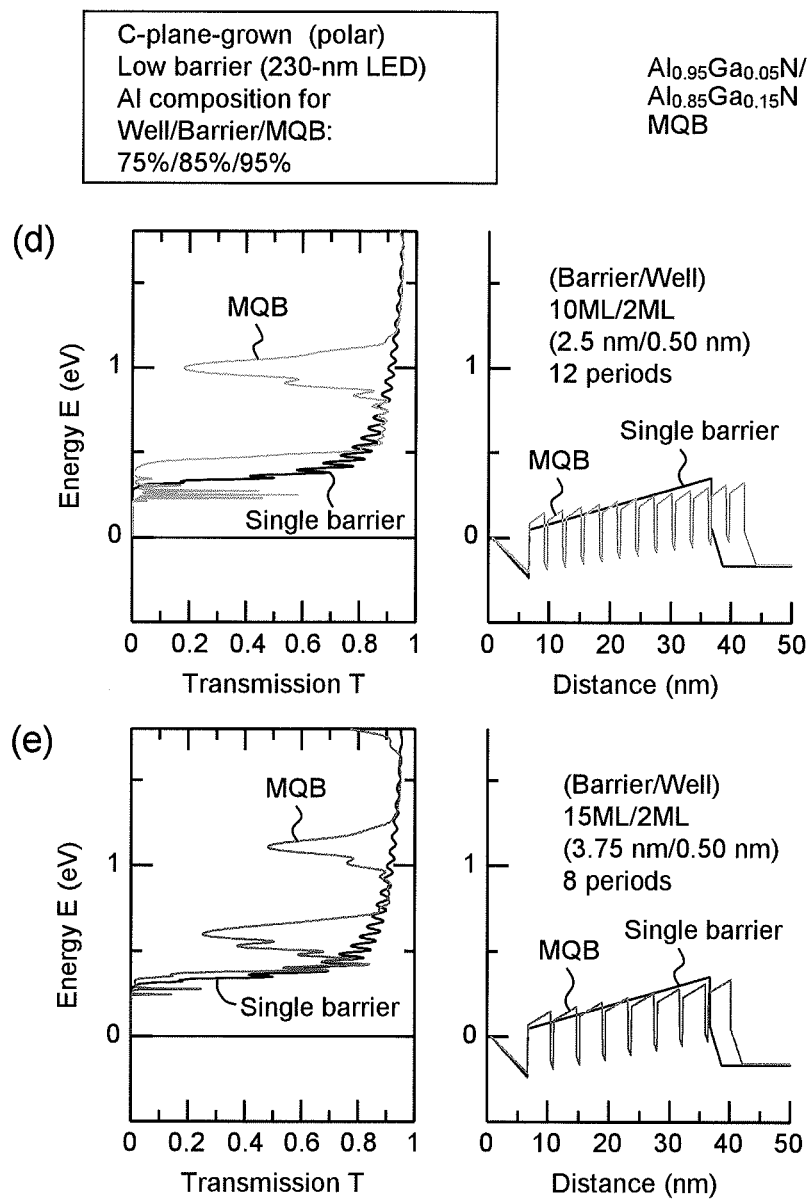
FIG. 19B shows characteristics of C-plane-grown (but not A-plane-grown) MQBs substantially similar to those obtained in Embodiment 1.
Figure 20:
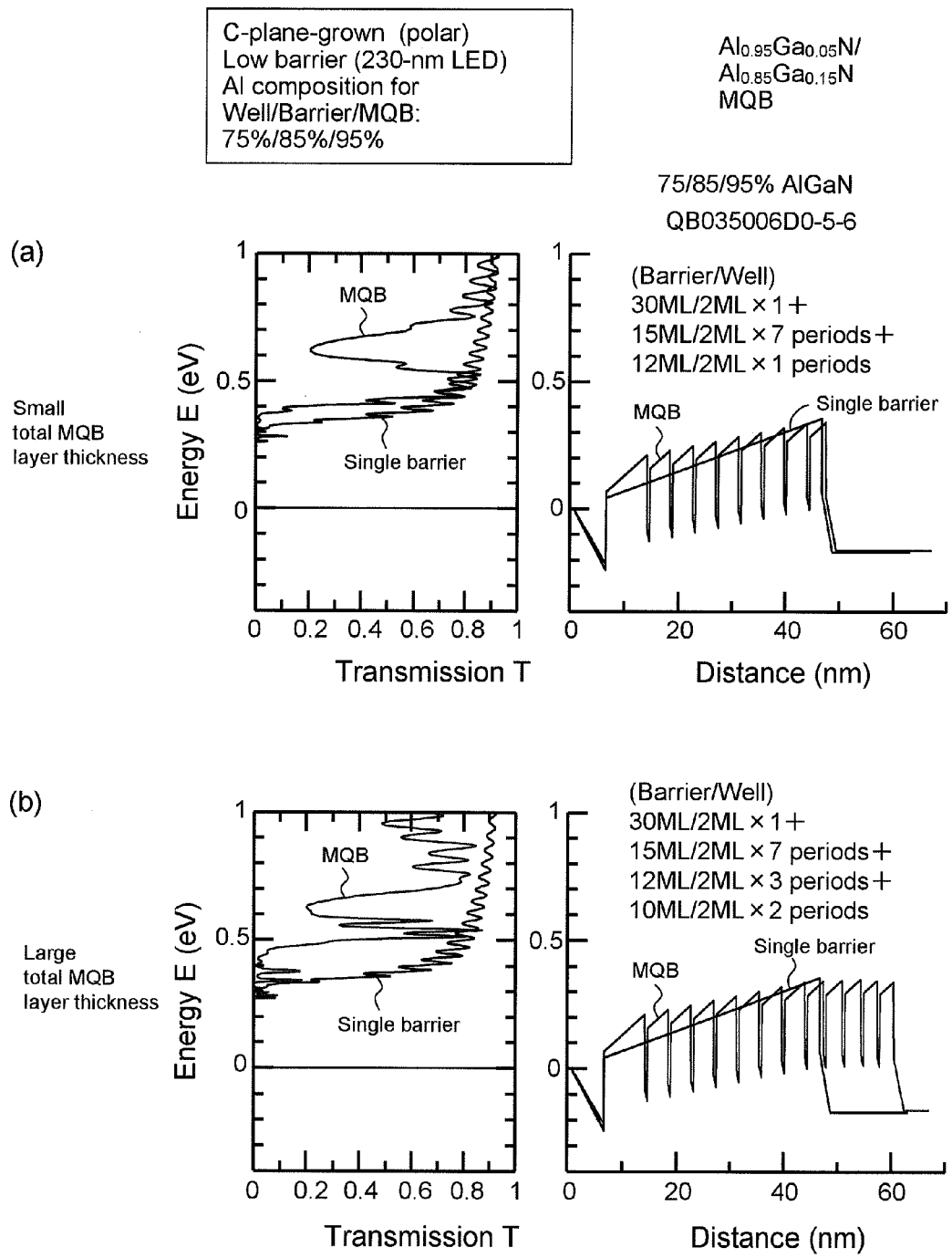
FIG. 20 shows characteristics of C-plane-grown (but not A-plane-grown) MQBs substantially similar to those obtained in Embodiment 1.

Similarly, FIG. 19 shows examples of reflectance analysis results for low barriers. The influence of polarization is reduced compared with a case in which the Al composition ratio is large; however, reflectance broadening effects derived from polarization still cannot be ignored. FIG. 20 shows total MQB layer thickness dependences of MQB effects for low barriers. When the total MQB thickness is 40 nm, the effective barrier height is about 1.3 times that of a single barrier. When the total MQB thickness is 55 nm, it is about 1.5 times the same. The results indicate that electron blocking effects of an MQB are better than those of a single barrier regardless of total MQB thickness.

The above results indicate that a significant increase in the effective barrier height can be achieved for C-plane-grown polar crystals, as in the cases of non-polar crystals.

Examples of UV light-emitting elements are explained above. However, the multiquantum barrier structure of the present invention also can be applied to nitride semiconductor light-emitting elements having different light-emitting wavelengths.

(Droop Improvement and LD Efficiency Improvement of Near-UV, Purple, Blue, and Green LEDs)

That is to say, for blue LEDs used for white lamps that have been in progress for commercialization, very high levels of external quantum efficiency (EQE) can be achieved during low current operation; however, EQE declines during high-power operation. Such droop is a serious problem. One possible factor that causes such droop is a decrease in electron injection efficiency due to electron leakage upon high current injection, as in the case of UV LEDs. In order to improve the droop, it is important to introduce an electron-blocking layer with a sufficiently large electron barrier height. One possible solution is to insert an AlGaN electron-blocking layer with a high Al composition (20%-50%). However, in consideration of management of conduction of a low-resistance p-type layer and strains, the use of such an AlGaN electron-blocking layer with a high Al composition for a blue LED rather causes an unfavorable decline in device efficiency. Meanwhile, even if an MQB comprises a barrier layer with an Al composition of as low as 10% or less, an effective electron blocking height several times higher than the barrier layer height can be achieved, making it possible to obtain the maximum effects at a low Al composition. Accordingly, the above droop can be improved while realizing conduction of a low-resistance p-type layer and low strain of each layer. As described above, the use of MQB is very important because it results in the improvement of efficiency upon high current injection, allowing stable high-power operation of blue LEDs. Similarly, MQB effects are believed to be very useful for near-UV or green light-emitting elements. The effects are thus very important to realize high-efficiency nitride light-emitting elements with widely ranging wavelengths of 220-550 nm.

(Summary)

The use of MQB results in electron blocking effects greater than those obtained with the use of a single barrier. In addition, the higher the barrier height and/or the longer the MQB period, the better the electron blocking effects in the case of either an A-plane-grown polar crystal or a C-plane-grown polar crystal.

Moreover, electron blocking can be achieved for a wide range of energy levels with the use of MQB by changing MQB periods alternately. Thus, electron blocking effects obviously greater than those obtained with MQB with the same number of periods can be achieved.

(Effects of the Present Invention)

According to the Embodiments of the present invention, the following effects can be obtained.
1) Electron injection efficiency improvement for UV LEDs
2) Droop improvement for UV LEDs
3) UV LD oscillation
4) Droop improvement for near-UV, purple, blue, green LEDs and LD efficiency improvement
Further details are described below.

(Electron Injection Efficiency Improvement for UV LEDs)

In the previous studies of the present inventors, even when AlN having the highest barrier height or AlGaN with an Al composition of 95% or more was used for an electron-blocking layer, the electron injection efficiencies of AlGaN UV LEDs were as low as 10%-30% (in cases of 240- to 280-nm LEDs). This was a major obstacle to the realization of high-efficiency UV LEDs. In addition, such low electron injection efficiency is derived from the low hole concentration of p-type AlGaN, and thus it has been considered impossible to overcome. By making use of MQBs formed in accordance with design standards suggested based on the present invention, it would become possible to solve such underlying problems. Thus, MQB effects are very important for realization of high-efficiency AlGaN-based UV LEDs.

(Realization of UV LDs)

In addition, electron leakage into the p-side layer is accelerated following elevation in the carrier density in the light-emitting layer region caused by an increase in the injected current density. The injected current density for UV LDs is about 10-100 times that for UV LEDs. Therefore, the electron injection efficiency for UV LDs further declines compared with that for UV LEDs, which results in destruction of UV LDs due to overheating before the current density reaches the oscillation threshold. Even if oscillation can take place, high output cannot be obtained. As described above, MQB has a feature of achieving a high electron blocking height, and thus MQB is highly effective for reflection of electrons having high energy levels generated as a result of an increase in the carrier density. MQB is therefore believed to significantly contribute to UV LD oscillation and high-efficiency UV LD technology.

(Droop Improvement for UV LEDs)

UV LEDs can be operated with reduced droop because high electron injection efficiencies can be achieved at high injection currents. Thus, stable UV LEDs capable of maintaining efficiency without reduction even at high-power output can be provided.

(Droop Improvement for Near-UV, Purple, Blue, Green LEDs and LD Efficiency Improvement)

In addition, for blue LEDs used for white lamps that have been in progress for commercialization, very high levels of external quantum efficiency (EQE) can be achieved during low current operation; however, EQE declines during high-power operation. Such droop is a serious problem. One possible factor that causes such droop is a decrease in electron injection efficiency due to electron leakage upon high current injection, as in the case of UV LEDs. In order to improve the droop, it is important to introduce an electron-blocking layer with a sufficiently large electron barrier height. One possible solution is to insert an AlGaN electron-blocking layer with a high Al composition (20%-50%). However, in consideration of management of conduction of a low-resistance p-type layer and strains, the use of such an AlGaN electron-blocking layer with a high Al composition for a blue LED rather causes an unfavorable decline in device efficiency. Meanwhile, even if an MQB comprises a barrier layer with an Al composition of as low as 10% or less, an effective electron blocking height several times higher than the barrier layer height can be achieved, making it possible to obtain the maximum effects at a low Al composition. Accordingly, the above droop can be improved while realizing conduction of a low-resistance p-type layer and low strain of each layer. As described above, the use of MQB is very important because it results in the improvement of efficiency upon high current injection, allowing stable high-power operation of blue LEDs. Similarly, MQB effects are believed to be very useful for near-UV or green light-emitting elements. The effects are thus very important to realize high-efficiency nitride light-emitting elements with widely ranging wavelengths of 220-550 nm.

INDUSTRIAL APPLICABILITY

The present invention can be applied to nitride semiconductor UV LEDs/LDs and near-UV, purple, blue, and green LEDs/LDs.

All publications, patents, and patent applications cited herein are incorporated herein by reference in their entirety.

The invention claimed is:

1. A nitride semiconductor light-emitting element that emits light at a wavelength of 220 to 390 nm, comprising:
  an $Al_yGa_{1-y}N$ ($0 \leq y \leq 1$) buffer layer disposed on a substrate;
  an $Al_{y0}Ga_{1-y0}N$ ($0 \leq y0 \leq 1$) n-type layer disposed on the buffer layer;
  a quantum-well light-emitting layer comprising an $Al_{y1}Ga_{1-y1}N$ quantum well layer and an $Al_{y2}Ga_{1-y2}N$ barrier layer ($0 \leq y1 < y2 \leq 1$) disposed on the n-type layer;
  an $Al_{y3}Ga_{1-y3}N$ ($0 \leq y3 \leq 1$) p-type layer disposed on the quantum-well light-emitting layer; and
  a multiquantum-barrier electron-blocking layer disposed on the p-type layer,
  wherein the multiquantum-barrier electron-blocking layer comprises alternately layered pairs of an $Al_{y4}Ga_{1-y4}N$ barrier layer and an $Al_{y5}Ga_{1-y5}N$ valley layer ($0 \leq y5 < y4 \leq 1$) with a constant thickness period or with a 1st thickness period and a 2nd thickness period that differs from the 1st thickness period, and, wherein a thickness period for the alternate layers increases or decreases in a stepwise manner from the quantum-well light emitting layer side to an opposite side to the substrate.

2. A nitride semiconductor light-emitting element that emits light at a wavelength of 220 to 390 nm, comprising:
   an $Al_yGa_{1-y}N$ ($0 \leq y \leq 1$) buffer layer disposed on a substrate;
   an $Al_{y0}Ga_{1-y0}N$ ($0 \leq y0 \leq 1$) n-type layer disposed on the buffer layer;
   a quantum-well light-emitting layer comprising an $Al_{y1}Ga_{1-y1}N$ quantum well layer and an $Al_{y2}Ga_{1-y2}N$ barrier layer ($0 \leq y1 < y2 \leq 1$) disposed on the n-type layer;
   an $Al_{y3}Ga_{1-y3}N$ ($0 \leq y3 \leq 1$) p-type layer disposed on the quantum-well light-emitting layer; and
   a multiquantum-barrier electron-blocking layer disposed on the p-type layer,
   wherein the multiquantum-barrier electron-blocking layer is a non-polar layer disposed on an A-plane or M-plane or a layer disposed on a semipolar plane of an underlying crystal for the multiquantum-barrier electron-blocking layer.

3. A process for growing a light-emitting element structure on a group-III nitride single crystal, comprising the steps of:
   growing an AlyGa1-yN ($0 \leq y \leq 1$) buffer layer on a substrate;
   growing an $Al_{y0}Ga_{1-y0}N$ ($0 \leq y0 \leq 1$) n-type layer on the buffer layer;
   growing a quantum-well light-emitting layer comprising an $Al_{y1}Ga_{1-y1}N$ quantum well layer and an $Al_{y2}Ga_{1-y2}N$ barrier layer ($0 \leq y1 < y2 \leq 1$) on the n-type layer;
   growing an $Al_{y3}Ga_{1-y3}N$ ($0 \leq y3 \leq 1$) p-type layer on the quantum-well light-emitting layer; and
   growing a multiquantum-barrier electron-blocking layer by alternately layering pairs of an $Al_{y4}Ga_{1-y4}N$ barrier layer and an $Al_{y5}Ga_{1-y5}N$ valley layer ($0 \leq y5 < y4 \leq 1$) on the p-type layer
   wherein the multiquantum-barrier electron-blocking layer is a non-polar layer disposed on an A-plane or M-plane or a layer disposed on a semipolar plane of an underlying crystal for the multiquantum barrier electron-blocking layer.

4. A nitride semiconductor light-emitting element that emits light at a wavelength of 220 to 390 nm, comprising:
   an $Al_yGa_{1-y}N$ ($0 \leq y \leq 1$) buffer layer disposed on a substrate;
   an $Al_{y0}Ga_{1-y0}N$ ($0 \leq y0 \leq 1$) n-type layer disposed on the buffer layer;
   a quantum-well light-emitting layer comprising an $Al_{y1}Ga_{1-y1}N$ quantum well layer and an $Al_{y2}Ga_{1-y2}N$ barrier layer ($0 \leq y1 < y2 \leq 1$) disposed on the n-type layer;
   an $Al_{y3}Ga_{1-y3}N$ ($0 \leq y3 \leq 1$) p-type layer disposed on the quantum-well light-emitting layer; and
   a multiquantum-barrier electron-blocking layer disposed on the p-type layer, wherein
   the multiquantum-barrier electron-blocking layer disposed on the p-type layer comprises a plurality of alternately layered pairs of an $Al_{y4}Ga_{1-y4}N$ barrier layer and an $Al_{y5}Ga_{1-y5}N$ valley layer ($0 \leq y5 < y4 \leq 1$),
   wherein the alternately layered pairs comprise:
   1st pairs of layers and the 2nd pairs of layers that are arranged in that order from the quantum-well light-emitting layer side to an opposite side to the substrate; and
   another layer of another pair of layers that is disposed between the 1st pairs of layers and the 2nd pairs of layers, and
   wherein a layer thickness of the 1st pairs of layers is greater or less than a layer thickness of the 2nd pairs of layers.

5. A nitride semiconductor light-emitting element that emits light at a wavelength of 220 to 390 nm, comprising:
   an $Al_yGa_{1-y}N$ ($0 \leq y \leq 1$) buffer layer disposed on a substrate;
   an $Al_{y0}Ga_{1-y0}N$ ($0 \leq y0 \leq 1$) n-type layer disposed on the buffer layer;
   a quantum-well light-emitting layer comprising an $Al_{y1}Ga_{1-y1}N$ quantum well layer and an $Al_{y2}Ga_{1-y2}N$ barrier layer ($0 \leq y1 \leq y2 < 1$) disposed on the n-type layer;
   an $Al_{y3}Ga_{1-y3}N$ ($0 \leq y3 \leq 1$) p-type layer disposed on the quantum-well light-emitting layer; and
   a multiquantum-barrier electron-blocking layer disposed on the p-type layer,
   wherein
   the multiquantum-barrier electron-blocking layer disposed on the p-type layer comprises a plurality of alternately layered pairs of an $Al_{y4}Ga_{1-y4}N$ barrier layer and an $Al_{y5}Ga_{1-y5}N$ valley layer ($0 \leq y5 < y4 \leq 1$),
   wherein the alternately layered pairs include:
   1st, 2nd, and 3rd pairs of layers that are arranged in that order from the quantum-well light-emitting layer side to an opposite side to the substrate; and
   another layer or another pair of layers that is disposed among the 1st, the 2nd, and the 3rd pairs of layers, and
   wherein a layer thickness of the 1st pairs of layers is greater than a layer thickness of the 2nd pairs of layers, and the layer thickness of the 2nd pairs of layers is greater than a layer thickness of the 3rd pairs of layers, or wherein a layer thickness of the 1st pairs of layers is less than a layer thickness of the 2nd pairs of layers, and the layer thickness of the 2nd pairs of layers is less than a layer thickness of the 3rd pairs of layers.

6. The nitride semiconductor light-emitting element according to claim 4, wherein a thickness of the barrier layer and a thickness of valley layer in an identical pairs of layers are the same when measured in units of monolayer.

7. The nitride semiconductor light-emitting element according to claim 4, which is a light-emitting diode.

8. An electric apparatus comprising a light source with the nitride semiconductor light-emitting element according to any of claim 1.

9. An electric apparatus comprising a light source with the nitride semiconductor light-emitting element according to any of claim 2.

10. An electric apparatus comprising a light source with the nitride semiconductor light-emitting element according to any of claim 4.

11. An electric apparatus comprising a light source with the nitride semiconductor light-emitting element according to any of claim 5.

* * * * *